United States Patent
Pincu et al.

(10) Patent No.: US 7,400,062 B2
(45) Date of Patent: Jul. 15, 2008

(54) RACK LEVEL POWER MANAGEMENT

(75) Inventors: David Pincu, Holon (IL); Roni Blaut, Netanya (IL); Alon Ferentz, Bat Yam (IL); Dror Korcharz, Bat Yam (IL); Yaniv Giat, Modiin (IL)

(73) Assignee: Microsemi Corp. - Analog Mixed Signal Group Ltd., Hod Hasharon (IL)

( * ) Notice: Subject to any disclaimer, the term of this patent is extended or adjusted under 35 U.S.C. 154(b) by 291 days.

(21) Appl. No.: 11/261,707

(22) Filed: Oct. 31, 2005

(65) Prior Publication Data

US 2006/0082222 A1    Apr. 20, 2006

Related U.S. Application Data

(63) Continuation-in-part of application No. 11/118,420, filed on May 2, 2005, and a continuation-in-part of application No. 10/750,856, filed on Jan. 5, 2004, now Pat. No. 7,146,258, which is a continuation of application No. PCT/IL03/00832, filed on Oct. 14, 2003.

(60) Provisional application No. 60/695,190, filed on Jun. 30, 2005, provisional application No. 60/644,002, filed on Jan. 18, 2005, provisional application No. 60/569,235, filed on May 10, 2004, provisional application No. 60/418,599, filed on Oct. 15, 2002.

(51) Int. Cl.
*H02J 1/00* (2006.01)
*H02J 3/00* (2006.01)
*H02J 3/14* (2006.01)
*H02M 1/10* (2006.01)

(52) U.S. Cl. .................................... 307/29

(58) Field of Classification Search ............ 307/29
See application file for complete search history.

(56) References Cited

U.S. PATENT DOCUMENTS 4,649,535 A  *  3/1987  Ulug ........................ 370/451

(Continued)

FOREIGN PATENT DOCUMENTS

EP           0955573 A1    11/1999
WO       WO 96/19764      6/1996

OTHER PUBLICATIONS

International Search Report for parallel PCT application—PCT/IL2005/001135 published by European Patent Office.
Written Opinion of the ISA for parallel PCT application—PCT/IL2005/001135 published by European Patent Office.

*Primary Examiner*—Michael J Sherry
*Assistant Examiner*—Dru M Parries
(74) *Attorney, Agent, or Firm*—Simon Kahn

(57) ABSTRACT

A system for rack level power management, the system comprising: at least one power source; a management module; and a plurality of power managed modules in communication with the management module and connected to draw power from the at least one power source, each of the plurality of power managed modules comprising a power manager and an operating circuit, the operating circuit being operable at a plurality of power drawing levels responsive to the power manager, the management module being operative to allocate a power budget to each of the plurality of power managed modules and communicate the allocated power budgets to the power managers, each of the power managers being operative to control the operating circuit of the power managed module to be operable at a power drawing level within the allocated budget.

32 Claims, 12 Drawing Sheets

U.S. PATENT DOCUMENTS

| | | |
|---|---|---|
| 5,483,656 A | 1/1996 | Oprescu et al. |
| 5,544,064 A | 8/1996 | Beckwith ................... 364/483 |
| 5,550,702 A | 8/1996 | Schmidt et al. ............ 361/103 |
| 5,612,580 A | 3/1997 | Janonis et al. ................ 307/64 |
| 5,652,893 A | 7/1997 | Ben-Meir et al. ........... 395/750 |
| 5,969,515 A | 10/1999 | Oglesbee ................... 323/283 |
| 5,986,902 A | 11/1999 | Brkovic ....................... 363/50 |
| 6,101,108 A | 8/2000 | Wittenbreder, Jr. ........... 363/65 |
| 6,108,183 A | 8/2000 | Beene ...................... 361/93.8 |
| 6,144,194 A | 11/2000 | Varga ........................ 323/285 |
| 6,233,693 B1 | 5/2001 | Berglund et al. |
| 6,404,607 B1 | 6/2002 | Burgess et al. ................ 361/58 |
| 6,473,608 B1 | 10/2002 | Lehr et al. ................... 455/402 |
| 6,643,566 B1 | 11/2003 | Lehr et al. ................... 700/286 |
| 6,841,979 B2 | 1/2005 | Berson et al. ............... 323/282 |
| 7,203,849 B2 | 4/2007 | Dove |
| 7,240,225 B2 | 7/2007 | Brewer et al. |
| 2003/0065958 A1 | 4/2003 | Hansen et al. ............... 713/300 |
| 2005/0146219 A1 | 7/2005 | Pincu et al. ................... 307/18 |
| 2005/0272402 A1 | 12/2005 | Ferentz ....................... 455/402 |

* cited by examiner

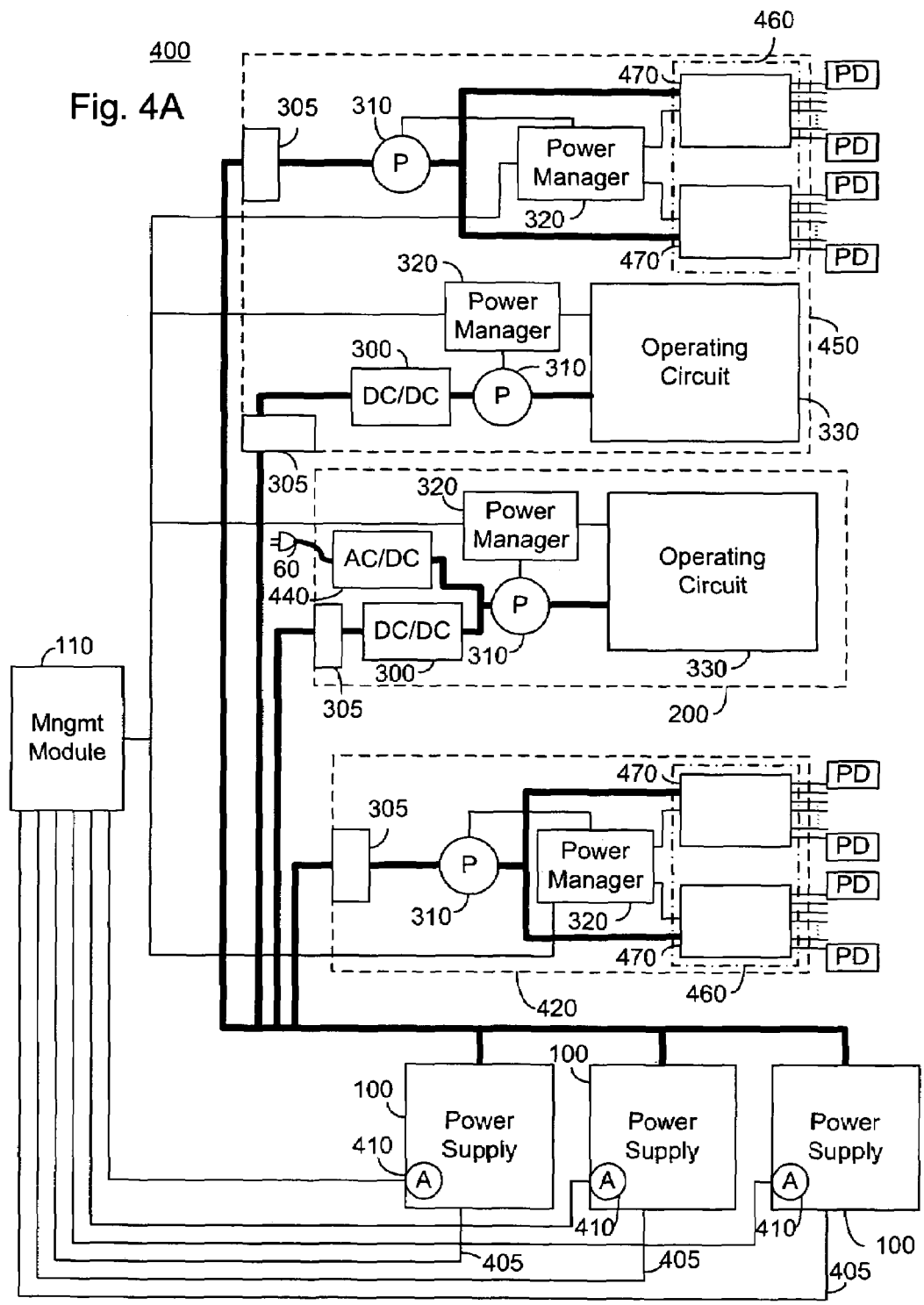

RACK LEVEL POWER MANAGEMENT

CROSS-REFERENCE TO RELATED APPLICATIONS

This application claims priority from U.S. Provisional Patent Applications Ser. No. 60/644,002 filed Jan. 18, 2005 entitled "System for Providing Power over Ethernet through a Patch Panel" and Ser. No. 60/695,190 filed Jun. 30, 2005 entitled "Backplane Power Management" and is a continuation in part of U.S. patent application Ser. No. 10/750,856 filed Jan. 5, 2004 now U.S Pat. No. 7,146,258 entitled "Direct Current Power Pooling" which is a continuation of PCT Patent Application PCT/IL03/00832 filed Oct. 14, 2003 which claims priority from U.S. Provisional Patent Application Ser. No. 60/418,599 filed Oct. 15, 2002. This application is also a continuation in part of U.S. patent application Ser. No. 11/118,420 filed May 2, 2005 entitled "Method for Rapid Port Power Reduction" which claims priority from U.S. Provisional Patent Application Ser. No. 60/569,235 filed May 10, 2004. This application is related to co-filed U.S. patent application Ser. No. 11/261,704 entitled "Rack Level Power Management for Power over Ethernet" . The entire contents of each of the above applications are incorporated herein by reference.

BACKGROUND OF THE INVENTION

The present invention relates to the field of power management, and more particularly to a system providing rack level power management for a telecommunications rack utilizing a centralized DC power source.

Systems comprising multiple modules, such as telecommunication systems, are often rack mounted, in which a plurality of independent modules are secured to a common rack, which is typically 19" wide. Each module in the rack is typically supplied with an on board power supply drawing power from a common AC mains. The on board power supply of each unit thus functions to convert AC mains power to a local DC power at the appropriate voltage for the electronics in the module.

A module which is utilizing only a small amount of energy, such as when the module is off or in a standby mode, still consumes and wastes energy. Furthermore, a multiplicity of independent small power supplies is inefficient, with supply begins to exhibit an increased temperature. This increase in temperature leads to a shortened life for the power supply. Thus, certain modules in the rack may experience early failure due to power supply stress, while neighboring modules may be operating at low utilization rates.

Power over Ethernet (PoE) is a technology enabling the delivery of power to powered devices (PD) from a power sourcing equipment (PSE) over communication cabling. A standard for PoE has been published by the Institute of Electrical and Electronics Engineers, Inc., New York, N.Y. as IEEE Std. 802.3af-2003 the entire contents of which is incorporated herein by reference. A PSE detects a PD requesting power, and in the event the PSE elects to power the PD, optionally classifies the power requirements of the detected PD, and then powers the PD within a pre-determined time after the completion of detection. PoE is a scalable technology, in which additional PDs with associated power requirements may be added by the user after an initial installation. The additional power requirements may grow to be in excess of the originally supplied power source. PoE may be supplied either from a PSE associated with switch/hub equipment, known commercially as a PoE enabled switch, or from a midspan PSE module. Midspan PSE modules may support one or more ports, with units of 1, 8, 12, 24 and 48 ports being commercially available. PoE enabled switches and midspan PSE modules are collectively denoted herein as PoE devices.

Prior art systems require a dedicated additional power source to be added as a module, feeding the additional required power. The dedicated additional power source is typically initially underutilized, and only experiences optimum utilization as the system power needs grow. This underutilized dedicated additional power source is thus unavailable in the event that one of the other modules in the system has reached maximum utilization of its on-board power supply.

Chassis and blade telecommunication switch equipment has been designed to ensure maximum up-time. The chassis comprises a housing for receiving and interconnecting by means of a backplane: blades; switch modules; management modules; power supplies; cooling fans; and other components. Chassis are expensive, however preferably are designed to provide redundancy and extremely high levels of service. For example, a plurality of cooling fan blades may be supplied, one cooling fan blade providing redundancy for an operating cooling fan blade. Similarly, chassis typically supply some level of redundancy for power sources and management modules. Unfortunately, chassis are expensive, and limit the purchaser to the use of equipment compatible with the backplane of the chassis. As described above, rack level equipment allows for the use of modules which are rack mounted and may be interconnected with standardized cabling. Thus, the use of rack level equipment provides certain flexibility and the ability to avoid an initial high cost associated with the chassis. Unfortunately, the use of rack level equipment does not provide the levels of redundancy associated with chassis equipment.

U.S. Pat. No. 5,652,893 issued to Ben-Meir et al discloses a power management system for a local area network hub. A power source, also known as a power supply, is provided having one or more elements providing a maximum power available for the system. Manageable modules are connected to the switching hub, each of the manageable modules having a memory providing information as to the power requirements of the module. A controller module comprising a microprocessor calculates the power requirements of the system and enables or disables manageable modules in accordance with power availability. Unfortunately, the system only allows for two states for each module, enabled and disabled. Thus, a module may not be powered at a low or medium power state. The embodiment of Ben-Meir is an example of chassis equipment.

What is needed therefore, and is not provided by the prior art, is a system providing rack level power management, in which power is allocated to rack mounted modules, with modules receiving a variable allocation of power responsive to power availability and the needs and priority levels associated with modules in the rack.

SUMMARY OF THE INVENTION

Accordingly, it is a principal object of the present invention to overcome the disadvantages of prior art. This is provided in the present invention by a system having at least one power source, a management module and a plurality of power managed modules in communication with the management module. Each of the power managed modules are arranged to be able to draw at least some power from the at least one power source. Each of the power managed modules comprises a power manager operable to control the power drawn by the power managed module. The management module allocates a power budget for each of the power managed modules, and the power managers of the power managed modules operate to control module operation so that power drawn is within the allocated budget.

Power managed modules may comprise PoE devices, switches, hubs, concentrators, computing equipment or other telecommunication modules operable at a plurality of power levels. Power managed modules may be supplied with an on board power supply, or preferably without an on board power supply. A central power source, preferably comprising at least one power supply, and further preferably comprising a plurality of power supplies, thus optimally supplies operating power for some or all of the power managed modules within the rack. The management module allocates power for each of the power managed modules drawing power.

The power budget is dynamically allocated based on pre-defined criteria. In the event of a failure of one or more power supplies of the central power source, in one embodiment the management module directs each of the power managed modules to change their power consumption to a pre-assigned amount. In another embodiment, in the event of a failure of one or more power supplies, the management module directs each of the power managed modules to reduce their power consumption by a pre-assigned amount.

In one embodiment, the power manager of at least one power managed module may sense a change in a voltage level from the at least one power source, and in response reduce power consumption. Such a response enables automatic power management by the power manager in the absence of communication from the management module.

In one embodiment the central power source comprises a plurality of power supplies, arranged in an N+M redundant arrangement. The management module reserves the power of M redundant power supplies so as to provide the budgeted power in the absence of one or more failed power supplies. The invention thus provides chassis functionality for distributed rack level equipment.

In one embodiment the system provides a plurality of buses, a first bus of which is used for ongoing communication of power requirements and budgets, and a second bus being used for emergency communication, such as in the event of a failure of at least one power supply of the central power source. A plurality of scenarios are generated and pre-transmitted to the modules, preferably over the first bus. In the event of a power event, such as the failure of one or more power supplies, one of the scenarios is implemented by broadcasting an implementing message, preferably over the second bus. Further preferably, at least one of the first and second bus is arranged in a closed ring configuration, thus allowing for identifying a communication breakdown by monitoring a loop back path.

The invention provides for a system for rack level power management, the system comprising: at least one power source; a management module; and a plurality of power managed modules in communication with the management module and connected to draw power from the at least one power source, each of the plurality of power managed modules comprising a power manager and an operating circuit, the operating circuit being operable at a plurality of power drawing levels responsive to the power manager, the management module being operative to allocate a power budget to each of the plurality of power managed modules and communicate the allocated power budgets to the power managers, each of the power managers being operative to control the operating circuit of the power managed module to be operable at a power drawing level within the allocated budget.

In one embodiment the management module is connected to receive an indication of power availability from the at least one power source, the power budgets being allocated responsive the received indication. In another embodiment the management module is operative to allocate power budgets on the basis of priority, each of the power managed modules being assigned a priority. In yet another embodiment the plurality of power managed modules exhibits a minimum required power and an additional power level in excess of the minimum required power, the management module being operative to assign a power budget for the minimum required power for each of the plurality of power managed modules, and only in the event that additional power is available, to allocate a power budget for the additional power level of at least one of the plurality of power managed modules. In one further embodiment the power budget for the additional power level is allocated on a priority basis.

In one embodiment each of the plurality of power managers comprises a power meter, the power manager of each of the plurality of power managers receiving an indication of power drawn from the power meter. In another embodiment at least one of the plurality of power managed modules is selected from the group consisting of power over a Ethernet enabled switch, a switch, a hub, a concentrator, a computing equipment, a power sourcing device, and a telecommunication module.

In one embodiment the operating circuit of at least one of the plurality of power managed modules comprises a power sourcing device operable for use with a power ready patch panel. In another embodiment the at least one power source and the management module are comprised within a single equipment shelf.

In one embodiment the management module is further operative to input a total power available, the allocated power budgets being responsive to the input total available power; In one further embodiment the system further comprises at least one module not comprising a power manager, the management module being operative to reduce the power requirements of the at least one module from the input total available power.

In one embodiment the management module is further operative to transmit at least one power budget scenario, the management module being further operative to monitor a condition of the at least one power source, and in the event of a change in the monitored condition, to broadcast a command to the plurality of power managed modules, the plurality of power managed modules being operative to adhere to the at least one power budget scenario responsive to the broadcast command. In one further embodiment the system further comprises a first bus and a second bus, wherein the management module is operative to transmit the at least one power budget scenario via the first bus and to broadcast the command via the second bus. In another further embodiment at least one of the first bus and the second bus in arranged in a closed ring arrangement.

In one embodiment the system further comprises at least one communication bus arranged in a closed ring configuration, the management module being operative to communicate the allocated power budgets via the at least one communication bus. In one further embodiment the management module is further operative to monitor a loop back of the at least one communication bus, and in the event that the communicated allocated power budgets are not received via the monitored loop back, to communicate the allocated power budgets via the loop back.

In one embodiment the power manager of at least one the plurality of power managed modules is further operative to sense a reduced voltage, and responsive to sensed reduced voltage to control the operating circuit associated with the power manager to reduce power drawn.

Independently the invention provides for a method of rack level power management comprising: providing at least one power source; providing a plurality of power managed modules connected to draw power from the at least one power source; allocating a power budget to each of the provided plurality of power managed modules; and transmitting the allocated power budgets to the plurality of power managed modules, each of the power managed modules controlling the drawn power to be within the transmitted allocated power budget.

In one embodiment the method further comprises receiving an indication of power availability from the at least one power source, the allocating being responsive the received indication. In another embodiment the allocating is at least partially on the basis of priority.

In one embodiment the provided plurality of power managed modules exhibit a minimum required power and an additional power level in excess of the minimum required power, the stage of allocating comprising: allocating the minimum required power for each of the plurality of power managed modules, and in the event that additional power is available, allocating a power budget for the additional power level of at least one of the plurality of power managed modules. In one further embodiment the allocating a power budget for the additional power level is on a priority basis.

In one embodiment the method further comprises for each of the plurality of provided power managed modules, receiving an indication of power drawn by the power managed module. In another embodiment at least one of the provided plurality of power managed modules is selected from the group consisting of power over a Ethernet enabled switch, a switch, a hub, a concentrator, a computing equipment, a power sourcing device, and a telecommunication module.

In one embodiment at least one of the provided plurality of power managed modules comprises a power sourcing device operable for use with a power ready patch panel.

In one embodiment the method further comprises: inputting a total power available, the allocating a power budget being responsive to the input total available power. In one further embodiment the method comprises providing at least one module not receiving the transmitted allocated power budget; and deducting the power requirements of the at least one module from the input total available power.

In one embodiment the method further comprises: monitoring a condition of the provided at least one power source; transmitting at least one power budget scenario to the provided plurality of power managed modules; and in the event of a change in the monitored condition, broadcasting a command to the plurality of power managed modules, the plurality of power managed modules adhering to the transmitted at least one power budget scenario responsive to the broadcast command. In another embodiment the method further comprises: at least one of the provided plurality of power managed modules sensing a reduced voltage; and responsive to sensed reduced voltage, reducing power drawn by the provided power managed module.

In one embodiment the method further comprises: monitoring a loop back of the transmitted allocated power budgets; and in the event that at least one of the transmitted allocated power budgets is not sensed by the monitoring, retransmitting the not sensed power budget via the loop back. In another embodiment the method further comprises: monitoring a condition of the provided at least one power source; transmitting at least one power budget scenario to the provided plurality of power managed modules via first bus; and in the event of a change in the monitored condition, broadcasting a command to the plurality of power managed modules via a second bus different than the first bus, the plurality of power managed modules adhering to the at least one power budget scenario responsive to the broadcast command.

Independently the invention provides for a system for rack level power management, the system comprising: at least one power source comprising a plurality of power supplies; a management module; and a plurality of power managed modules in communication with the management module and connected to draw power from the at least one power source, each of the plurality of power managed modules comprising a power manager and an operating circuit, the operating circuit being operable at a plurality of power drawing levels responsive to the power manager, the management module being operative to allocate a power budget to each of the plurality of power managed modules and communicate the allocated power budgets to the power managers, and being further operative to communicate a plurality of power scenarios and associated power budgets to the power managed modules, each of the power managers being operative to control the operating circuit of the power managed module to be operable at a power drawing level within the allocated budget, and in response to a communication from the management module to activate a scenario to control the operating circuit of the power managed module to be operable at a power drawing level within the power budget associated with the activated scenario.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 4A illustrates a high level block diagram of an embodiment of a management module and a plurality of power supplies in communication with at least one power managed module in accordance with the principle of the current invention;

DETAILED DESCRIPTION OF PREFERRED EMBODIMENTS

Figure 1:
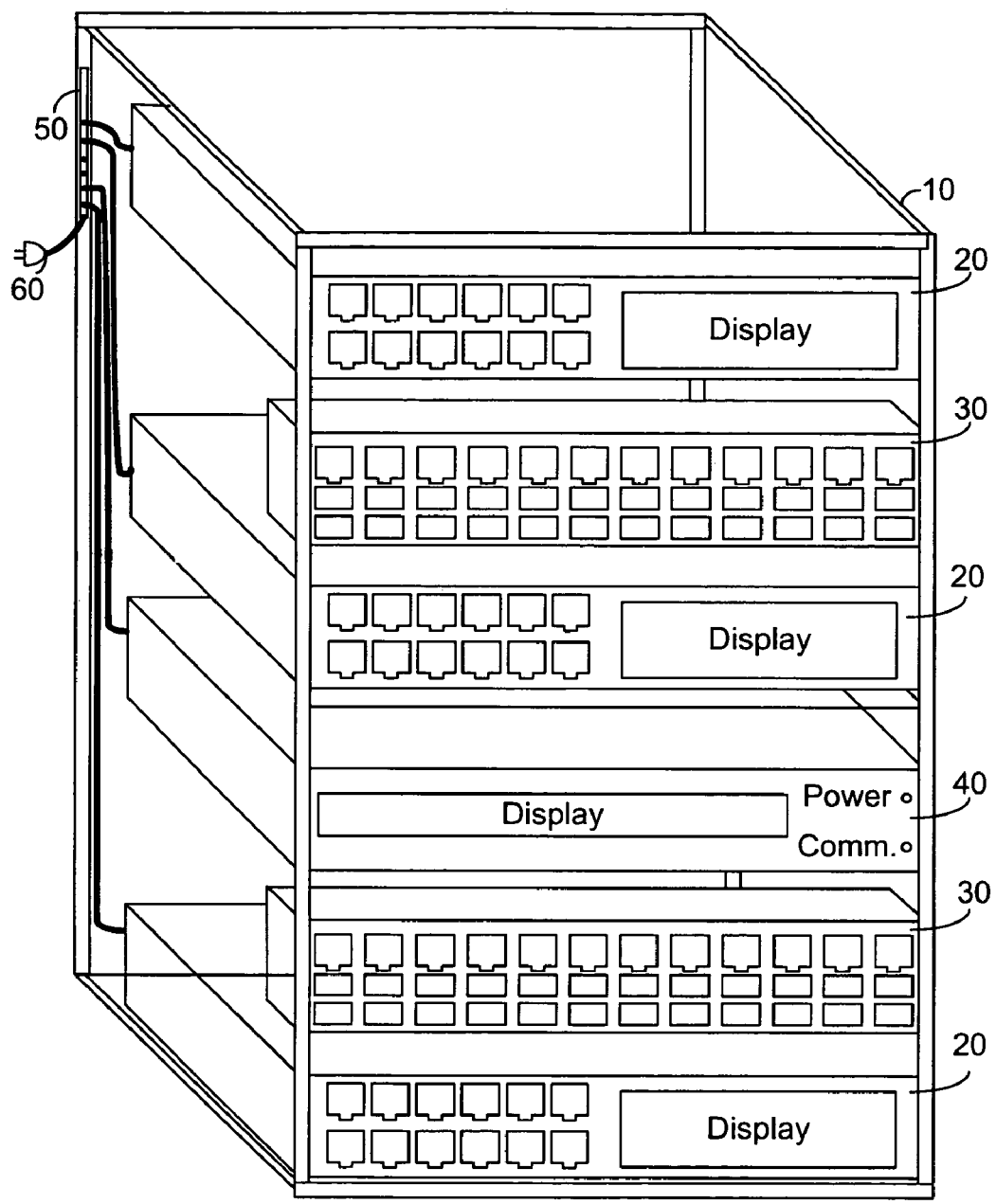
FIG. 1 illustrates a high level view of rack mounted telecommunication equipment according to the teaching of the prior art.

The present embodiments enable a system for rack level power management having at least one power source, a management module and a plurality of power managed modules in communication with the management module. Each of the power managed modules are arranged to be able to draw at least some power from the at least one power source. Each of the power managed modules comprises a power manager operable to control the power drawn by the power managed module. The management module allocates a power budget for each of the power managed modules, and the power managers of the power managed modules operate to control module operation so that power drawn is within the allocated budget.

Power managed modules may comprise PoE devices, switches, hubs, concentrators, computing equipment or other telecommunication modules operable at a plurality of power levels. Power managed modules may be supplied with an on board power supply, or preferably without an on board power supply. A central power source, preferably comprising at least one power supply, and further preferably comprising a plurality of power supplies, thus optimally supplies operating power for some or all of the power managed modules within the rack. The management module allocates power for each of the power managed modules drawing power.

The power budget is dynamically allocated based on pre-defined criteria. In the event of a failure of one or more power supplies of the central power source, in one embodiment the management module directs each of the power managed modules to change their power consumption to a pre-assigned amount. In another embodiment, in the event of a failure of one or more power supplies, the management module directs each of the power managed modules to reduce their power consumption by a pre-assigned amount.

In one embodiment, the power manager of at least one power managed module may sense a change in a voltage level from the at least one power source, and in response reduce power consumption. Such a response enables automatic power management by the power manager in the absence of communication from the management module.

In one embodiment the central power source comprises a plurality of power supplies, arranged in an N+M redundant arrangement. The management module reserves the power of M redundant power supplies so as to provide the budgeted power in the absence of one or more failed power supplies. The invention thus provides chassis functionality for distributed rack level equipment.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level view of telecommunication equipment mounted in a rack 10 according to the teaching of the prior art. Rack 10 comprises a plurality of switches 20, a plurality of patch panels 30, a modem 40, a power strip 50, and a connection to AC mains 60. Each of the plurality of switches 20 and modem 40 comprises an independent on board power suppply (not shown), and thus exhibit a connection to power strip 50. Patch panels 30 are unpowered, and function as interconnect points for connections to and from each of the switches 20 and user nodes (not shown). In a LAN, a patch panel serves as a sort of static switchboard, using cables to interconnect nodes to a switch/server of the local area network. A patch panel typically uses a jumper cable called a patch cord or a patch cable to create each interconnection typically between a switch port and a patch panel port representing a user node. The patch cables are not shown for clarity.

A module, such as one of switches 20 and modem 40, which is utilizing only a small amount of energy, such as when the module is off or in a standby mode, still consumes and wastes energy. Furthermore, a multiplicity of independent small power supplies is inefficient, as represented by the power supplies contained within each of switches 20 and modem 40, with the power supply in some modules outputting power at full capacity, while power supplies of other modules are at a low capacity. Power supply longevity is at least partially a function of the utilization rate, in which typically a highly utilized power supply begins to exhibit an increased temperature. This increase in temperature leads to a shortened life for the power supply. Thus, certain modules in the rack may experience early failure due to power supply stress, while neighboring modules may be operating at low utilization rates.

Figure 2A:
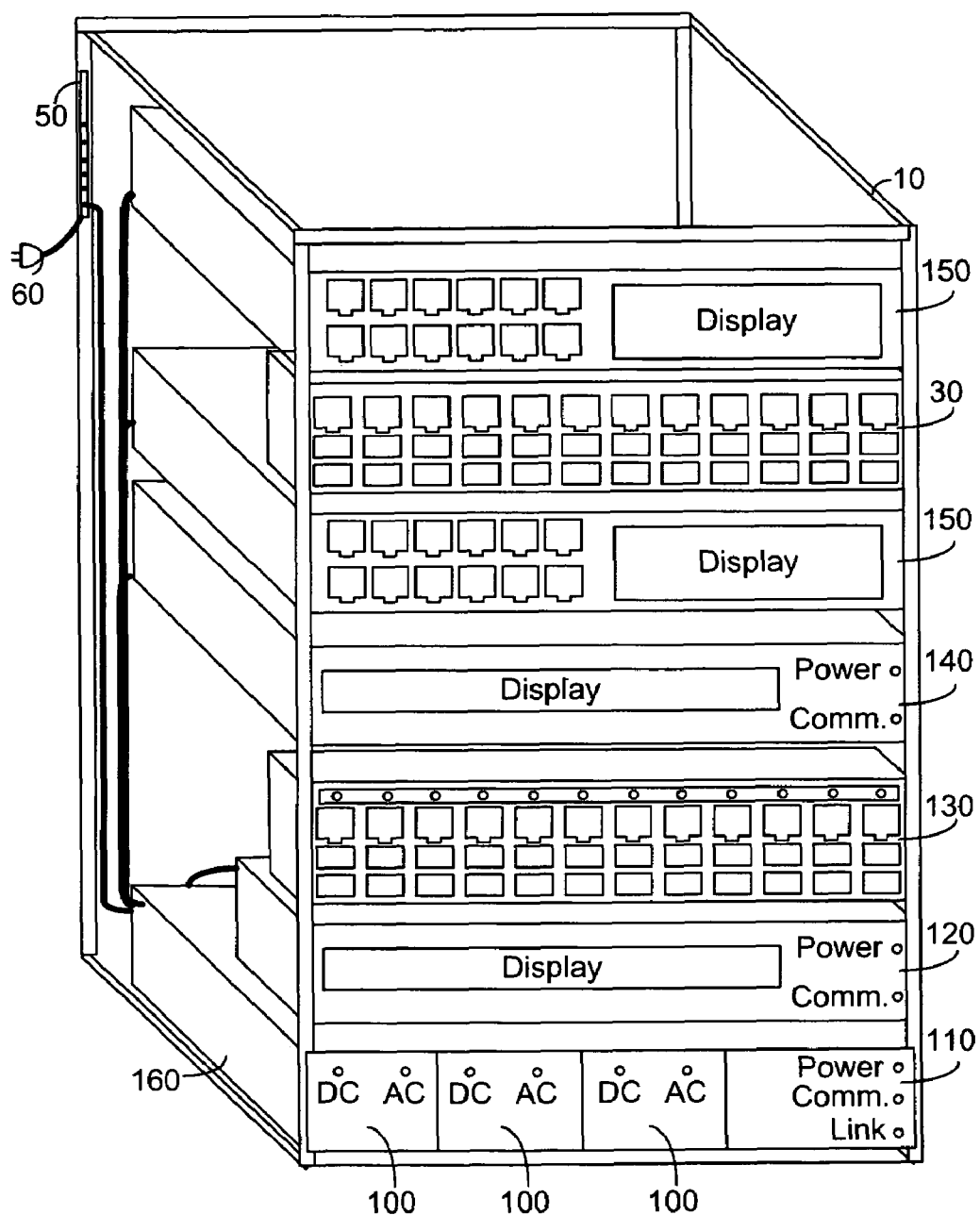
FIG. 2A illustrates a high level view of a first embodiment of rack mounted telecommunication equipment according the principle of the current invention.

FIG. 2A illustrates a high level view of a first embodiment of rack mounted telecommunication equipment according the principle of the current invention, comprising a rack 10 securing a plurality of power supplies 100, a management module 110, a power sourcing device 120, a power ready patch panel 130, a power managed module 140, a plurality of switches 150, a patch panel 30, a power strip 50 and a connection to AC mains 60. The plurality of power supplies 100 are shown contained within a single shelf 160 of rack 10 as a single power source, shelf 160 further comprising management module 110. Power managed module 140 may comprise a switch, hub equipment, modem, midspan PSE, computing equipment or gateway without exceeding the scope of the invention.

In an exemplary embodiment, shelf 160 is no more than 1 U high, and is designed with a backplane such that each of the plurality of power supplies 100 may be hot swappable. The backplane is further designed such that a power supply 100 may not be plugged into the slot intended to receive management module 110 and management module 110 may not be plugged into any slot intended to receive a power supply 100.

The plurality of power supplies 100 each exhibit a connection to power strip 50, however in contrast to the prior art configuration of FIG. 1, other modules do not exhibit a connection to power strip 50. Shelf 160 exhibits connections to power sourcing device 120, power managed module 140 and switches 150, with the connection supplying both power from the plurality of power supplies 100 and data communication with management module 110. Power sourcing device 120, power managed module 140 and switches 150 are shown as not comprising an on board AC/DC power supply, as indicated by the lack of connection to power strip 50, however this is not meant to be limiting in any way. Any one or more of power sourcing device 120, power managed module 140 and switches 150 may comprise an on board AC/DC power supply, with power supplies 100 supplying either additional or redundant power without exceeding the scope of the invention.

In operation, power supplies 100 are connected in a power sharing arrangement, and management module 110 is arranged to receive an indication of power output from each of power supplies 100. In an exemplary embodiment power supplies 100 are arranged as single power source in an N+M redundant arrangement, with M power supplies 100 acting as redundant sources for N operating power supplies 100. In one embodiment, each of power supplies 100 supply an indication of power output, and in another embodiment a separate current indicator, and preferably a voltage meter, is supplied. Management module 110 is in communication with each of the modules drawing power from power supplies 100, such as power sourcing device 120, power managed module 140 and switches 150, and obtains an indication of the power requirements from each of the modules. Power is allocated to each of the modules according to pre-defined criteria, and the modules are operative to draw power in accordance with the allocation. In one embodiment power is allocated equally to all of the modules, in another embodiment power is allocated in accordance with priority and in another embodiment power is allocated at a minimum operating level to all modules and additional power is allocated in accordance with priority.

Figure 2B:
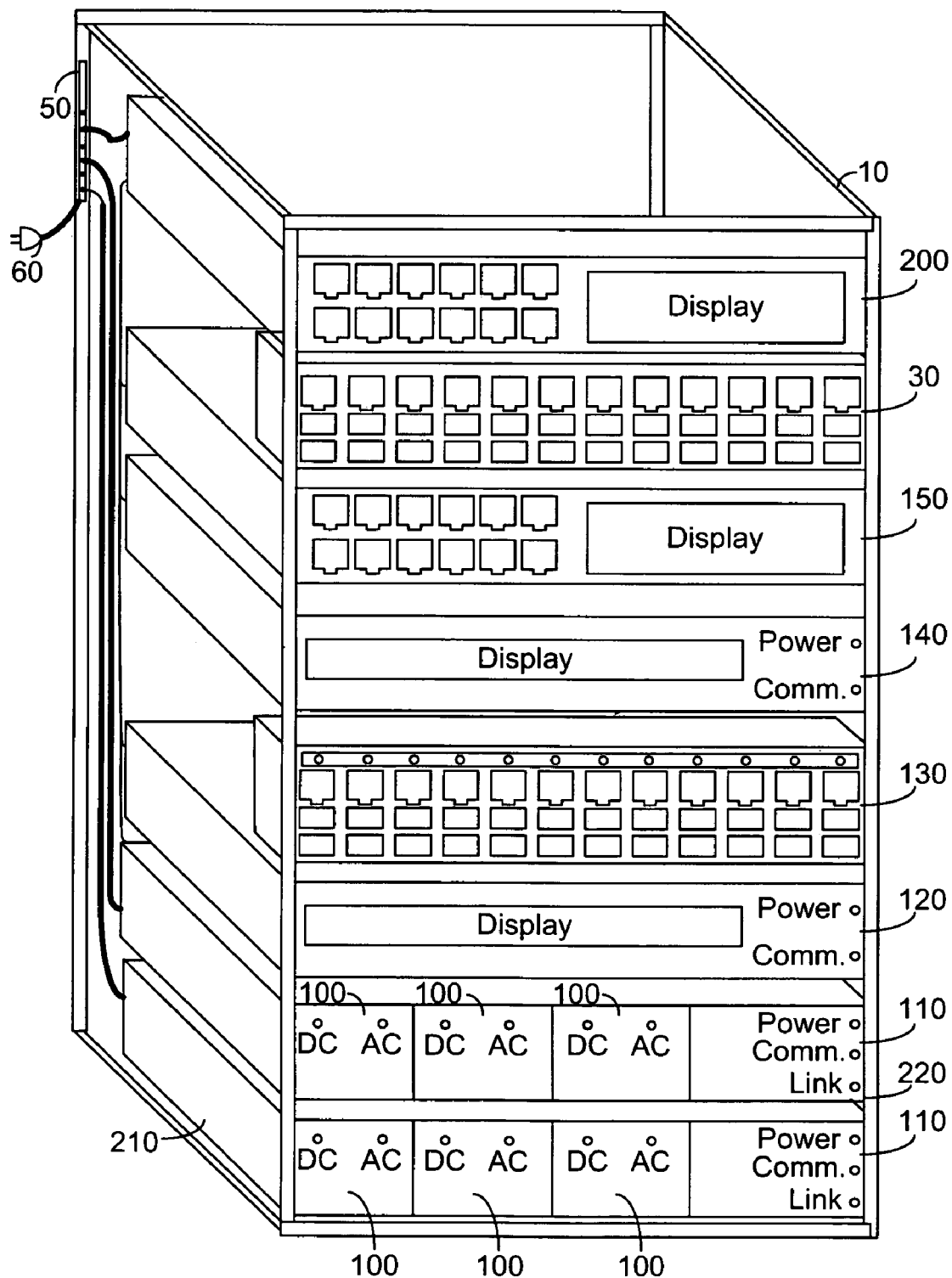
FIG. 2B illustrates a high level view of a second embodiment of rack mounted telecommunication equipment according the principle of the current invention

FIG. 2B illustrates a high level view of a second embodiment of rack mounted telecommunication equipment according the principle of the current invention comprising a rack 10 securing a first power shelf 210 comprising a plurality of power supplies 100 and a management module 110; a second power shelf 220 comprising a plurality of power supplies 100 and a redundant management module 110; a power sourcing device 120; a power ready patch panel 130; a power managed module 140; a switch 150; a switch having an on board power supply 200; a patch panel 30; a power strip 50; and a connection to AC mains 60. Power managed module 140 may comprise a switch, hub equipment, modem, midspan PSE, computing equipment or gateway without exceeding the scope of the invention.

In an exemplary embodiment, each of first power shelf 210 and second power shelf 220 is no more than 1 U high, and is designed with a backplane such that each of the plurality of power supplies 100 may be hot swappable. Each of first power shelf 210 and second power shelf 220 thus functions as a power source comprising a plurality of power supplies 100. Alternatively, first power shelf 210 and second power shelf 220 are arranged to function as a single power source. The backplane is further designed such that a power supply 100 may not be plugged into the slot intended to receive management module 110 and management module 110 may not be plugged into any slot intended to receive a power supply 100.

The plurality of power supplies 100 each exhibit a connection to power strip 50, however in contrast to the prior art configuration of FIG. 1, other modules, with the exception of switch having on board power supply 200, do not exhibit a connection to power strip 50. First power shelf 210 and second power shelf 220 exhibit connections to power sourcing device 120, power managed module 140, switch 150 and switch having on board power supply 200, with the connection supplying both power from the plurality of power supplies 100 and data communication with management modules 110. Power sourcing device 120, power managed module 140 and switches 150 are shown as not comprising an on board power supply, as indicated by the lack of connection to power strip 50, however this is not meant to be limiting in any way. Any one or more of power sourcing device 120, power managed module 140 and switches 150 may comprise an on board power supply, with power supplies 100 supplying either additional or redundant power without exceeding the scope of the invention.

In operation, power supplies 100 are connected in a power sharing arrangement, and management module 110 is arranged to receive an indication of power output from each of power supplies 100. In an exemplary embodiment power supplies 100 are arranged as single power source in an N+M redundant arrangement, with M power supplies 100 acting as redundant sources for N operating power supplies 100. First power shelf 210 acts as a first power source and second power shelf 220 acts as a second power source. In an alternative embodiment, first power shelf 210 and second power shelf 220 are arranged to act a single unified power source. In one embodiment, each of power supplies 100 supply an indication of power output, and in another embodiment a separate current indicator, and preferably a voltage meter, is supplied. Management module 110 of first power shelf 210 and management module 110 of second power shelf 220 act as redundant management modules, with a first one of the management modules 110 acting as an active module and a second one of the management modules 110 acting as a redundant module.

The active management module 110 is in communication with each of the modules drawing power from power supplies 100, such as power sourcing device 120, power managed module 140, switch 150 and switch having on board power supply 200, and obtains an indication of the power requirements from each of the modules. Power is allocated to each of the modules according to pre-defined criteria, and the modules are operative to draw power in accordance with the allocation. In one embodiment power is allocated equally to all of the modules, in another embodiment power is allocated in accordance with priority and in another embodiment power is allocated at a minimum operating level to all modules and additional power is allocated in accordance with priority. Redundant management module 110 monitors the indications received by active management module 110, and thus acts as a redundant module capable of operation in the event of a failure of active management module 110.

Figure 3:
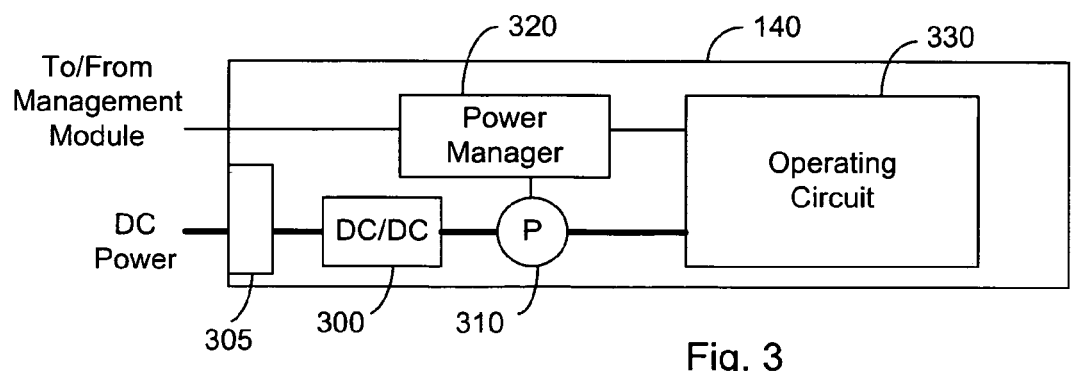
FIG. 3 illustrates a high level block diagram of an embodiment of a power managed module in accordance with the principle of the current invention.

FIG. 3 illustrates a high level block diagram of an embodiment of a power managed module 140 in accordance with the principle of the current invention. Power managed module 140 comprises a hot swap controller 305, a DC/DC converter 300, a power meter 310, a power manager 320 and an operating circuit 330. Hot swap controller is arranged to allow for hot swapping of power managed module 140. DC/DC converter 300 is arranged to receive DC operating power from the plurality of power supplies 100 of FIGS. 2A, 2B via hot swap controller 305. The output of DC/DC converter 300 is passed through power meter 310 to operating circuit 330. Power manager 320 is arranged to be in communication with management module 110, to receive an indication of power drawn by operating circuit 330 from power meter 310 and to communicate with operating circuit 330. In one embodiment the output of DC/DC converter 300 is an intermediate operating voltage, typically on the order of 5-12 volts, and operating circuit 330 comprises at least one point of load converter (not shown) operable to convert the intermediate operating voltage to the appropriate voltage as required by operating circuit 330. In an exemplary embodiment the at least one point of load converter communicate with a CPU via an I$^2$C bus and supply power at the required voltage on demand.

In operation, power manager 320 receives data indicative of a power allocation for power managed module 140 from management module 110. Power manager 320, responsive to the received power allocation, monitors power drawn by operating circuit 330 via power meter 310. In one embodiment power meter 310 further embodies a power limiter, and power manager 320 is operative to limit power drawn by operating circuit 330 by controlling the power limiting functionality of power meter 310. In the event that power drawn by operating circuit 330 is in excess of the received power allocation, power manager 320 is operative to communicate with operating circuit 330 to reduce the power drawn to be within the budget. In one embodiment, operating circuit 330 comprises computing equipment, and power drawn is reduced by lowering the speed of operation, preferably by reducing the voltage supplied by the point of load converter. In another embodiment operating circuit 330 comprises a plurality of PoE PSEs each PSE supplying power through an output port to a PD via communication cabling, and power is disabled from at least one PD thereby reducing power drawn. In yet another embodiment, operating circuit 330 comprises a power sourcing device operable to supply power to a plurality of PDs via a power ready patch panel as described further in co-filed patent application entitled "System for Providing Power over Ethernet through a Patch Panel" the entire contents of which are incorporated herein by reference. Conversely, in the event that power drawn by operating circuit 330 is less than the received power allocation, power manager 320 is operative to communicate with operating circuit 330 indicating the available additional power. In one embodiment, operating circuit 330 comprises computing equipment, and power drawn is increased by increasing the speed of operation, thereby improving performance. In another embodiment operating circuit 330 comprises at least one PoE PSE, and power is enabled for at least one PSE having connected thereto a PD thereby increasing power drawn.

Power manager 320 preferably takes into account any losses associated with hot swap controller 305, DC/DC converter 300 and power meter 310. Preferably, power drawn by power manager 320 is tapped after power meter 310 (not shown), and is thus included within the power drawn indicated by power meter 310. In another embodiment, power drawn by power manager 320 is a predetermined quantity, and the pre-determined quantity is reduced from the power allocation received. In yet another embodiment the power allocation received is net of power losses associated with hot swap controller 305, DC/DC converter 300, power meter 310 and power drawn by power manager 320.

FIG. 4A illustrates a high level block diagram of an embodiment of a system 400 comprising management module and a plurality of power sources in communication with at least one power managed module in accordance with the principle of the current invention. System 400 comprises a plurality of power supplies 100 each exhibiting a status indicator signal 405, and a current indicator 410; a management module 110; a PoE device 420; a switch having on board power supply 200; and a PoE enabled switch 450. PoE device 420 comprises a hot swap controller 305, a power meter 310, a power manager 320, and an operating circuit 460 comprising a plurality of PoE managing circuits 470. Switch having on board power supply 200 comprises hot swap controller 305, a DC/DC converter 300, an AC/DC converter 440, a connection to AC mains 60, a power meter 310, a power manager 320, and an operating circuit 330. PoE enabled switch 450 comprises a first and second hot swap controller 305, a DC/DC converter 300, a first and second power meter 310, a first and second power manager 320, an operating circuit 330 and an operating circuit 460 comprising a plurality of PoE managing circuits 470. In an exemplary embodiment each PoE managing circuit 470 is attached to a number of ports, and some or all of the ports have attached thereto over twisted pair communication cabling a PD. Operating circuit 460 is shown as being a separate unit from power manager 320, however this is not meant to be limiting in any way. Power manager 320 may be incorporated into one or more of PoE managing circuit 470 without exceeding the scope of the invention. Power meter 310 is shown as being separate from power manager 320, however this is not meant to be limiting in any way, and power meter 310 may be integrated within power manager 320 without exceeding the scope of the invention.

The plurality of power supplies 100 are connected together in a power sharing arrangement, such as droop or active current sharing, illustrated herein as a common shared bus, and each of PoE device 420; switch having on board power supply 200; and PoE enabled switch 450 exhibits a connection to the common shared bus via a respective hot swap controller 305. In the embodiment shown, a majority of power drawn is intended for PoE applications, and thus power supplies 100 are isolated from non-PoE operating circuit 330 and the chassis. Within each of switch having on board power supply 200 and PoE enabled switch 450, DC/DC converter 300 receives power from the common shared bus via the respective hot swap controller 305, and operates to isolate and convert the power to the appropriate voltage for use with respective operating circuit 330 in accordance with isolation requirements of IEEE 802.3af. A power meter 310 and a power manager 320 is respectively associated with each respective operating circuit 330, 460 and a respective power meter 310. The respective power manger 320 is arranged to receive an input from the respective power meter 310, to be in communication with management module 110, and to be in communication with the respective operating circuit 330, 460. The respective power meter 310 is arranged to provide the respective power manager 320 an indication of power drawn by respective operating circuit 330, 460.

Switch having on board power supply 200 exhibits AC/DC converter 440 which receives AC mains power from AC mains connection 60. In an exemplary embodiment AC mains connection 60 comprises a connection through power strip 50 of FIGS. 2A, 2B.

Respective status indicators 405 are each connected to an input of management module 110. In an exemplary embodiment each status indicator 405 comprises information regarding at least one of a power good signal of the respective power supply 100, a temperature of the respective power supply 100 and a stress level of the respective power supply 100. Status indicator 405 is illustrated as a separate data connection from each power supply 100, however this is not meant to be limiting in any way. In one embodiment the data connection is replaced with external sensors, and in another embodiment the data connection is part of a data bus arrangement. Each current indicator 410 from respective power supply 100 is illustrated as a separate data connection from each power supply 100, however this is not meant to be limiting in any way. In one embodiment the data connection is replaced with external sensors, and in another embodiment the data connection is part of a data bus arrangement.

A data connection is exhibited between management module 110 and each power manager 320. In one embodiment the data connection between management module 110 and each power manger 320 is accomplished in a high speed data bus, such as an EIA 485 as defined by the Electronic Industry Alliance of Arlington, Va. EIA 485 is also known as RS 485. In another embodiment the data connection between management module 110 and each power manager 320 comprises a pair of data busses: a first data bus being of a high speed, such as 1 Mbps, and carrying ongoing messages as will be described further hereinto below; and a second data bus being of a lower speed, such as 100 Kbps, and carrying emergency messages and addressing information as will be described further hereinto below. The second data bus is hereinto referred to as the emergency bus. In an exemplary embodiment the data connection between management module 110 and each power manager 320 is accomplished via a bi-directional single twisted wire pair bus in a ring configuration. In such an embodiment management module 110 observes the bus to ensure that messages sent by management module 110 have traveled the entire bus. In the event of a sensed communication failure, messages are optionally resent in the reverse direction thereby improving communication reliability.

In operation, the plurality of power supplies 100 operate in a power sharing arrangement to supply power to each of PoE device 420; switch having on board power supply 200; and PoE enabled switch 450. Status indicators 405 output status information regarding respective power supplies 100, and are received by management module 110. Current indicators 410 output information regarding the output current of respective power supplies 100, and are received by management module 110. Management module 110 is further operable to communicate with each power manger 320 of PoE device 420, switch having on board power supply 200 and PoE enabled switch 450 so as to communicate data regarding the priority and to allocate respective power budgets. In one embodiment management module 110 further receives data regarding the priority level of each port to which a PD requesting power may be attached. Advantageously management module 110 thus has available an overall map of all connected PoE devices, modules and their priorities, enabling power to be allocated according to priority irrespective of the PoE managing circuit 470 to which a port is connected. PoE managing circuits 470 operate under control of the respective power manager 320 to interrogate, optionally classify, and subsequently power connected PDs.

Management module 110 is operative in a manner that will be explained further hereinto below, to maintain a table of power scenarios indicative of potential states of the various status indicators 405. Thus, in the event of a failure of one or more power supply 100, management module 110 responsive to the change in the respective status indicator 405 is operable to look up the appropriate actions in the pre-stored power scenario table, and broadcast a scenario number to each power manager 320. The use of a look up table and pre-transmitted scenarios enables management module 110 and power managers 320 to react insufficient time so as to reduce consumption thereby limiting the amount of time for which an overload condition may be present.

Each power manager 320 is preferably operable to receive a power budget from management module 110 and to control the operation of the respective operating circuit 330, 460 in accordance with the received budget. Thus, power manager 320 functions as a local power budget supervisor. In another embodiment the priority is set by a user utilizing a host computer or controller communicating with management module 110. In a further embodiment, priority may be set by a user for each PoE port powered by a PoE managing circuit 470, management module 110 communicating the received priority setting to PoE managing circuit 470 via the respective power manger 320. In another embodiment (not shown), further described in co-filed patent application entitled "System for Providing Power over Ethernet through a Patch Panel" whose entire contents is incorporated herein by reference, at least one operating circuit 460 supplies power to PDs via a power ready patch panel and the PoE managing circuit 470 receives configuration information, including a priority level, from the power ready patch panel. In such an embodiment, PoE managing circuit 470 receiving priority laden information from the power ready patch panel shares the priority information with management module 110 via respective power manager 320.

Switch having on board power supply 200 receives power from an AC mains via AC mains connection 60. In the event that power drawn by operating circuit 330 is in excess of the power supplied by AC/DC converter 440, additional power may be drawn from the plurality of power supplies 100. Total power drawn is monitored by power manager 320 of switch having on board power supply 200, and in the event that additional power has been allocated by management module 110, allows operating circuit 330 to increase power drawn in excess of power available from AC/DC converter 440. Additionally, in the event of a failure of AC mains power, and in the event that a battery or other source of uninterruptible power is connected as a power supply 100, power may be drawn by operating circuit 330 in the absence of AC mains power. Preferably, in such an embodiment, power manager 320 acts to minimize power consumption of operating circuit 330.

Figure 4B:
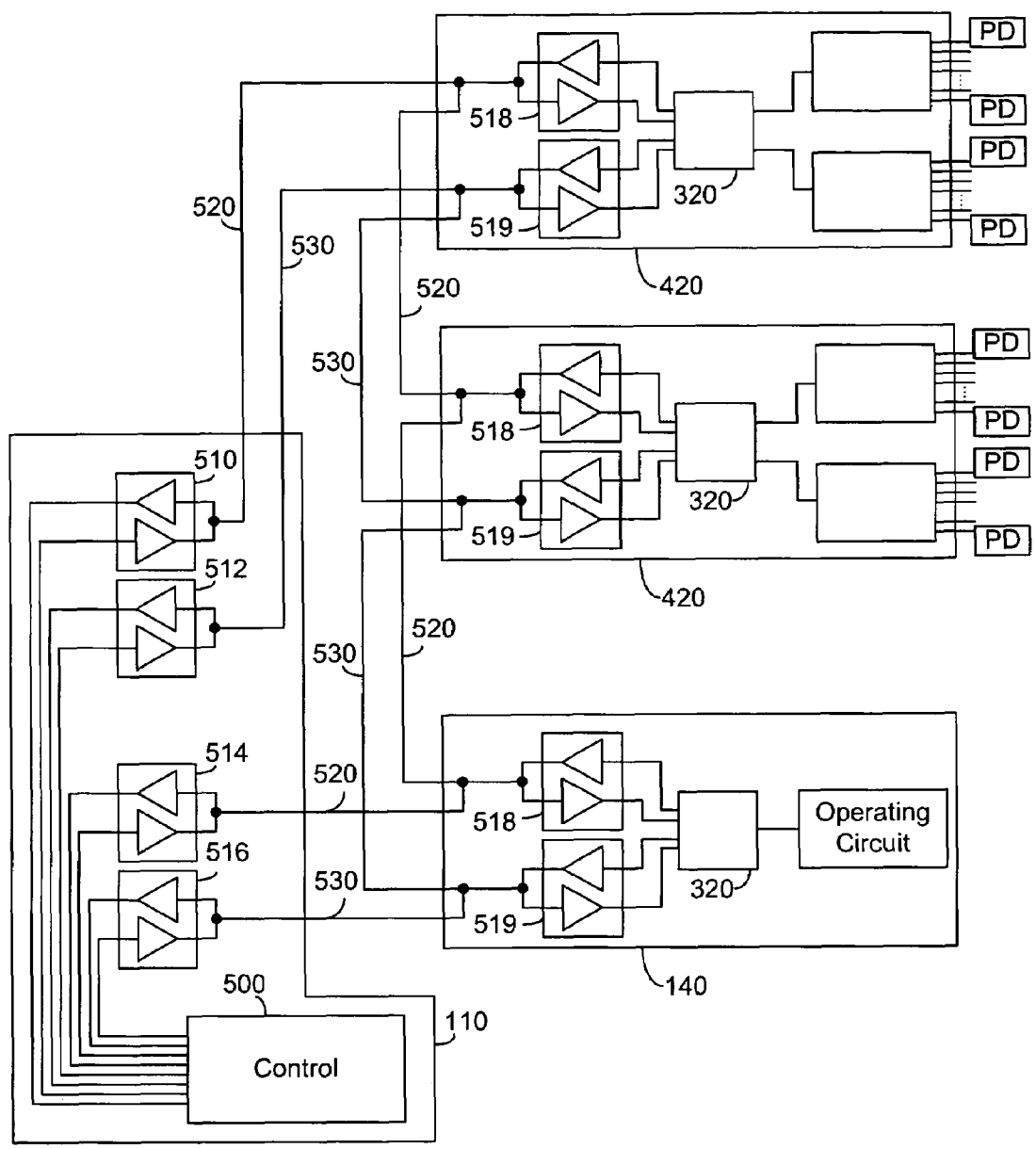
FIG. 4B is a high level block diagram of an embodiment of the data connection of FIG. 4A exhibiting a first and second data bus in accordance with the principle of the current invention.

FIG. 4B is a high level block diagram of an embodiment of the data connection of FIG. 4A exhibiting a first and second data bus in accordance with the principle of the current invention comprising: a management module 110; a first and second PoE device 420; a power managed module 140; a first bus 520; and a second bus 530. Management module 110 comprises a control circuit 500, a first transceiver 510, a second transceiver 512, a third transceiver 514, and a fourth transceiver 516. Each of first and second PoE devices 420 comprises a first transceiver 518, a second transceiver 519 and a power manager 320. Power managed module 140 comprises a first transceiver 518, a second transceiver 519 and a power manager 320.

Control 500 is connected to the input of the transmitter of each of first, second, third and fourth transceiver 510, 512, 514, 516 of management module 110 and to the output of the receiver of each of first, second, third and fourth transceiver 510, 512, 514, 516 of management module 110. The output of the transmitter of first transceiver 510 of management module 110 is connected to the receiver of first transceiver 510 of management module 110 and by a portion of first bus 520 to both the output of the transmitter of first transceiver 518 of first PoE device 420 and the input of the receiver of first transceiver 518 of first PoE device 420. The output of the transmitter of second transceiver 512 of management module 110 is connected to the receiver of second transceiver 512 of management module 110 and by a portion of second bus 530 to both the output of the transmitter of second transceiver 519 of first PoE device 420 and the input of the receiver of second transceiver 519 of first PoE device 420.

Power manager 320 of first PoE device 420 is connected to the output of the receiver of first transceiver 518 of first PoE device 420, to the input of the transmitter of first transceiver 518 of first PoE device 420, to the output of the receiver of second transceiver 519 of first PoE device 420, and to the input of the transmitter of second transceiver 519 of first PoE device 420. The output of the transmitter of first transceiver 518 of first PoE device 420 is connected by a portion of first bus 520 to both the output of the transmitter of first transceiver 518 of second PoE device 420 and the input of the receiver of first transceiver 518 of second PoE device 420. The output of the transmitter of second transceiver 519 of first PoE device 420 is connected by a portion of second bus 530 to both the output of the transmitter of second transceiver 519 of second PoE device 420 and the input of the receiver of second transceiver 519 of second PoE device 420.

Power manager 320 of second PoE device 420 is connected to the output of the receiver of first transceiver 518 of second PoE device 420, to the input of the transmitter of first transceiver 518 of second PoE device 420, to the output of the receiver of second transceiver 519 of second PoE device 420, and to the input of the transmitter of second transceiver 519 of second PoE device 420. The output of the transmitter of first transceiver 518 of second PoE device 420 is connected by a portion of first bus 520 to both the output of the transmitter of first transceiver 518 of power managed module 140, and the input of the receiver of first transceiver 518 of power managed module 140. The output of the transmitter of second transceiver 519 of second PoE device 420 is connected by a portion of second bus 530 to both the output of the transmitter of second transceiver 519 of power managed module 140 and the input of the receiver of second transceiver 519 of power managed module 140.

Power manager 320 of power managed module 140 is connected to the output of the receiver of first transceiver 518 of power managed module 140, to the input of the transmitter of first transceiver 518 of power managed module 140, to the output of the receiver of second transceiver 519 of power managed module 140, and to the input of the transmitter of second transceiver 519 of power managed module 140. The output of the transmitter of first transceiver 518 of power managed module 140 is connected by a portion of first bus 520 to both the output of the transmitter of third transceiver 514 of management module 110 and the input of the receiver of third transceiver 514 of management module 110. The output of the transmitter of second transceiver 519 of power managed module 140 is connected by a portion of second bus 530 to both the output of the transmitter of fourth transceiver 516 of management module 110 and the input of the receiver of fourth transceiver 516 of management module 110. In an exemplary embodiment each of transceivers 510, 512, 514, 516, 518, 519 operate according to EIA-485, and in a preferred embodiment first and second transceiver 510, 512 operate as the master for first and second buses 520, 530 respectively.

In operation first bus 520 and second bus 530 are connected in a daisy chain or ring arrangement, exhibiting internal direct connections in each of first, and second PoE devices 420 and power managed module 140, and first bus 520 and second bus 530 loop back to management module 110. Thus, first bus 520 and second bus 530 are operational irrespective of the operation of each of first and second PoE devices 420 and power managed module 140. Control 500 is operational to communicate ongoing messages to and from each of first and second PoE devices 420 and power managed module 140 via first transceiver 510 and first bus 520, and to further receive the transmitted messages via third transceiver 514 and the loop back path of first bus 520. Control 500 is further operational to communicate emergency messages to each of first and second PoE devices 420 and power managed module 140 via second transceiver 512 of management module 110 and second bus 530, and to further receive the transmitted emergency messages via fourth transceiver 516 of management module 110 and the loop back path of second bus 530.

Advantageously, control 500 monitors the loop back path of first bus 520, and in the event that messages transmitted by control 500 via first transceiver 510 of management module 110 are not received at third transceiver 514 of management module 110, control 500 is operational to notify a user of a communication break. Control 500 is further operational to retransmit messages not received at third transceiver 514 of management module 110 via third transceiver 514 of management module 110 via the loop back path. Thus, third transceiver 514 of management module 110 acts as a master for the portion of first bus 520 still connected to third transceiver 514 of management module 110 via the loop back path and first transceiver 510 of management module 110 acts as a master for the portion of first bus 520 connected to first transceiver 510 of management module 110, also called hereinafter the main path. Thus, first and second PoE devices 420 and power managed module 140 are in communication with management module 110 despite a break in first bus 520. In one embodiment control 500 further polls each of first and second PoE devices 420 and power managed module 140 via each of the main and loop back paths of first bus 520, and reports to a user an identifier of which PoE device 420 and power managed module 140 remain connected to each of the main and loop back paths of first bus 520.

Advantageously, control 500 monitors the loop back path of second bus 530, and in the event that messages transmitted by control 500 via second transceiver 512 of management module 110 are not received at fourth transceiver 516 of management module 110, control 500 is operational to notify a user of a communication break. Control 500 is further operational to retransmit messages not received at fourth transceiver 516 of management module 110 via fourth transceiver 516 of management module 110 via the loop back path.

Thus, fourth transceiver 516 of management module 110 acts as a master for the portion of second bus 530 still connected to fourth transceiver 516 of management module 110 via the loop back path and second transceiver 512 of management module 110 acts as a master for the portion of second bus 530 connected to second transceiver 512 of management module 110, also called hereinafter the main path. Thus, first and second PoE devices 420 and power managed module 140 are in communication with management module 110 despite a break in second bus 530. In one embodiment control 500 further polls each of first and second PoE device 420 and power managed module 420 via each of the main and loop back paths of second bus 530, and reports to a user an identifier of which PoE device 420 and power managed module 140 remain connected to each of the main and loop back paths of second bus 530.

Preferably, second bus 530 is held open to be available for time sensitive messages to be sent by control 500, and no time is lost by control 500 regaining control of second bus 530 due to communication from one of first and second PoE devices 420 and power managed module 140.

Figure 11A:
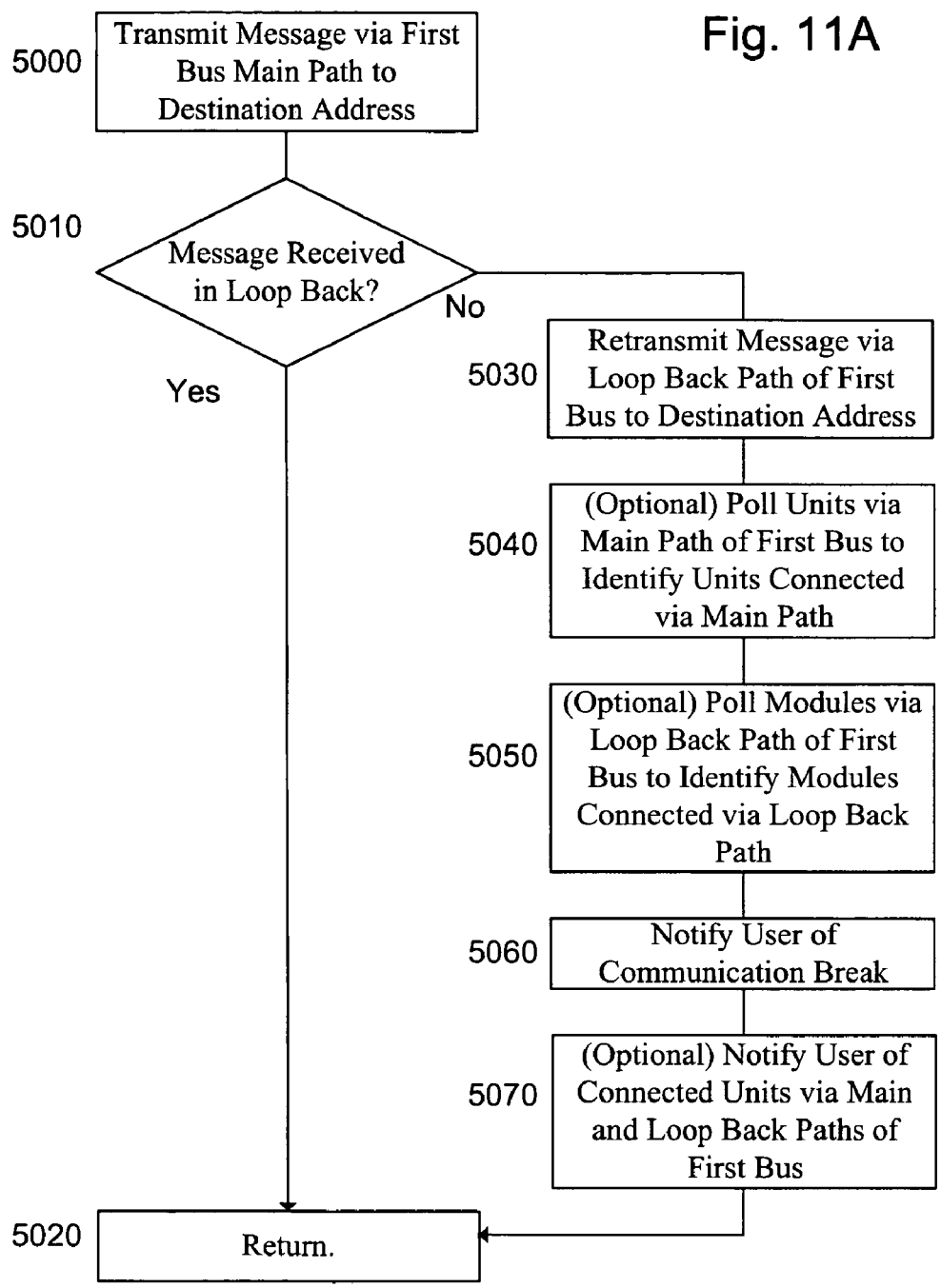
FIG. 11A is a high level flow chart of the operation of the management module of FIG. 4B to communicate via a main path of a first bus, and in the event of the transmitted message not being detected via the loop back path of the first bus, retransmitting the message via the loop back path of the first bus in accordance with the principle of the current invention.

FIG. 11A is a high level flow chart of the operation of management module 110 of FIG. 4B to communicate via a main path of first bus 520, and in the event of the transmitted message not being detected via the loop back path of first bus 520, retransmitting the message via the loop back path of first bus 520 in accordance with the principle of the current invention. In stage 5000, a message is transmitted via the main path of the first bus to a destination address, for example by utilizing first transceiver 510 of management module 110. Management module 110 preferably acts as the bus master and assigns addresses to each of first and second PoE devices 420, power managed module 140 and other devices found attached thereto.

In stage 5010, control 500 monitors the loop back path of first bus 520, for example via third transceiver 514 of management module 110. In the event that the message transmitted in stage 5000 is received via the loop back path, the communication ring of the first bus is intact, and in stage 5020 the routine returns.

In the event that in stage 5010 the message transmitted in stage 5000 is not received via the loop back path, indicating that the communication ring of first bus 520 is not intact, in stage 5030 the message of stage 5000 is retransmitted via the loop back path of first bus 520, for example by utilizing third transceiver 514 of management module 110. Thus, first and second PoE devices 420, power managed module 140, and other devices, which remain connected to management module 110 via the loop back path of first bus 520, receive communication irrespective of the break in first bus 520.

In optional stage 5040, devices are polled via the main path of first bus 520, and units responding are identified as connected via the main path to management module 110. In optional stage 5050, devices are polled via the loop back path of first bus 520, and units responding are identified as connected via the loop back path to management module 110. In stage 5060, management module 110 notifies a user of the communication break. In optional stage 5070, identifiers of units identified in optional stages 5040, 5050 are further communicated to the user, thus indicating further information as to the location of the break. In stage 5020 the routine returns.

Figure 11B:
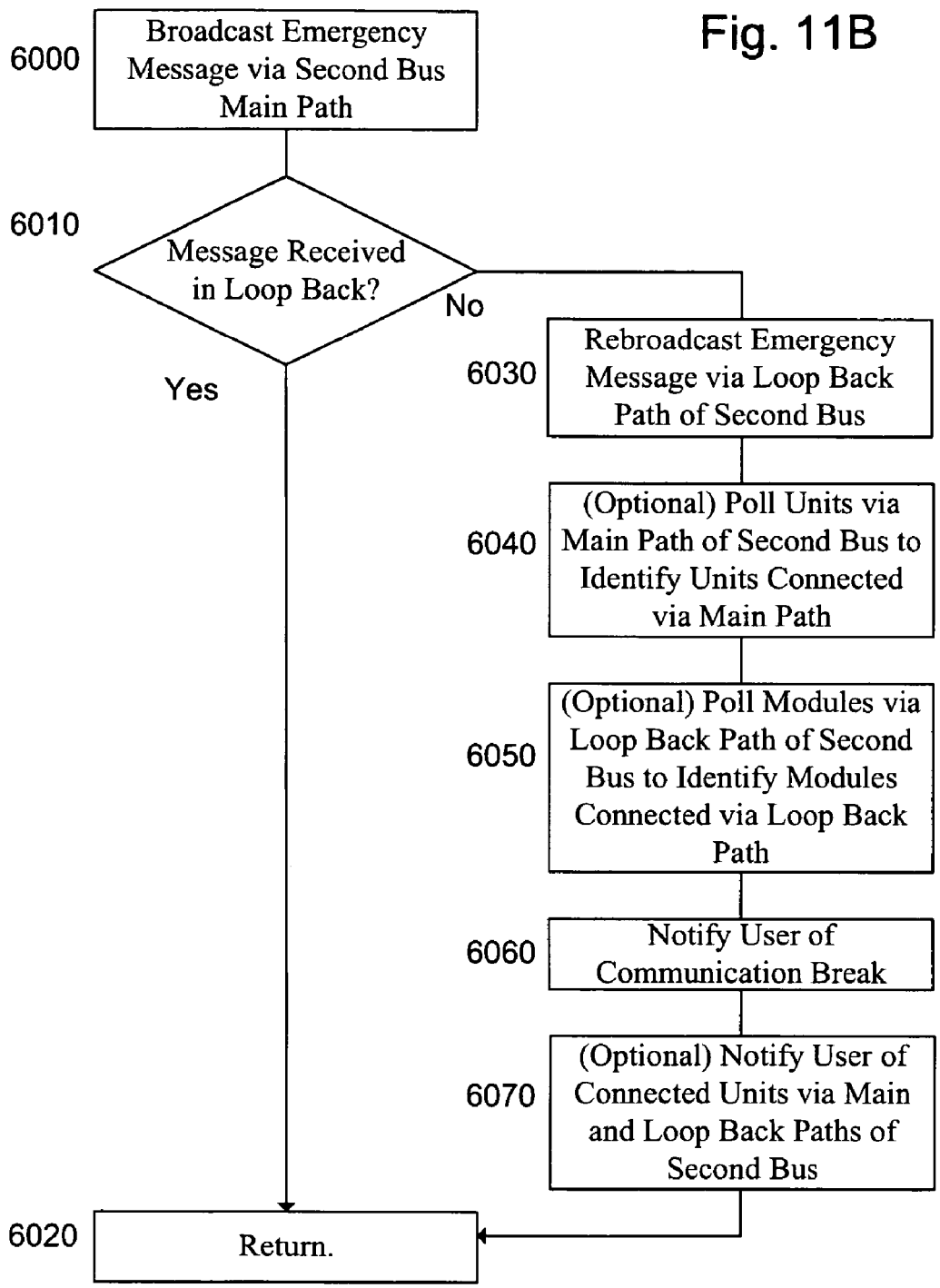
FIG. 11B is a high level flow chart of the operation of the management module of FIG. 4B to broadcast emergency messages via a main path of a second bus, and in the event of the broadcast message not being detected via a loop back path of the second bus, rebroadcasting the message via the loop back path of the second bus in accordance with the principle of the current invention; and Table I is a representation of an embodiment of the potential scenario chart produced as an outcome of the method of FIG. 8 in accordance with the principle of the invention.

FIG. 11B is a high level flow chart of the operation of management module 110 of FIG. 4B to broadcast emergency messages via a main path of second bus 530, and in the event of the broadcast message not being detected via the loop back path of second bus 530, rebroadcasting the message via the loop back path of second bus 530 in accordance with the principle of the current invention. In stage 6000, an emergency message is broadcast via the main path of the second bus to a destination address, for example by utilizing second transceiver 512 of management module 110. Management module 110 preferably acts as the bus master and assigns addresses to each of firs and second PoE devices 420, power managed module 140 and or other devices found attached thereto.

In stage 6010, control 500 monitors the loop back path of second bus 530, for example via fourth transceiver 516 of management module 110. In the event that the message broadcast in stage 6000 is received via the loop back path, the communication ring of the second bus is intact, and in stage 6020 the routine returns.

In the event that in stage 6010 the emergency message broadcast in stage 6000 is not received via the loop back path, indicating that the communication ring of second bus 530 is not intact, in stage 6030 the emergency message of stage 6000 is rebroadcast via the loop back path of second bus 530, for example by utilizing fourth transceiver 516 of management module 110. Thus, first and second PoE devices 420, power managed module 140, and other devices which remain connected to management module 110 via the loop back path of second bus 530, receive emergency broadcast messages irrespective of the break in second bus 530.

In optional stage 6040, devices are polled via the main path of second bus 530, and units responding are identified as connected via the main path to management module 110. In optional stage 6050, devices are polled via the loop back path of second bus 530, and units responding are identified as connected via the loop back path to management module 110. In stage 6060, management module 110 notifies a user of the communication break. In option stage 6070, identifiers of units identified in optional stages 6040, 6050 are further communicated to the user, thus indicating further information as to the location of the break. In stage 6020 the routine returns.

The routines of FIGS. 11A and 11B have been explained with second bus 530 being utilized for broadcast of emergency messages, and first bus 520 being utilized for ongoing communication; however this is not meant to be limiting in any way. Second bus 530 may be utilized to assign addresses for use by first bus 520 without exceeding the scope of the invention. First bus 520 and second bus 530 may proceed in a single cable, and thus a break in one of first bus 520 and second bus 530 may most likely be indicative of a break in a second one of first bus 520 and second bus 530 without exceeding the scope of the invention.

Figure 5:
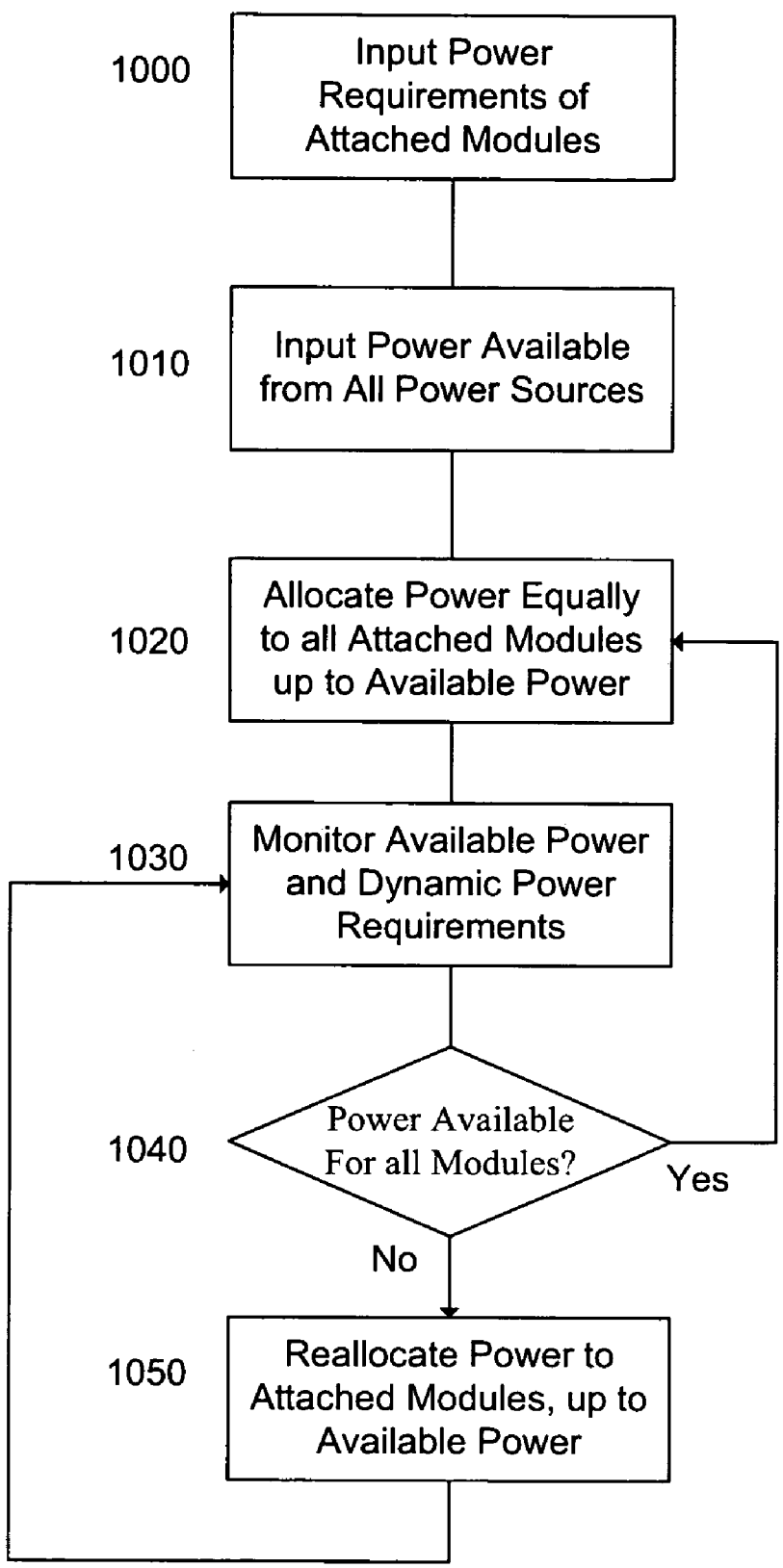
FIG. 5 illustrates a high level flow chart of an embodiment of the operation of the management module to allocate power equally to all power managed modules in accordance with the principle of the current invention.

FIG. 5 illustrates a high level flow chart of an embodiment of the operation of management module 110 of FIGS. 4A, 4B to allocate power equally to all power managed modules in accordance with the principle of the current invention. In stage 1000 the power requirements of all attached modules are input. In an exemplary embodiment, a minimum and a desired power requirement are supplied by the local power manager 320. It is to be understood that in this embodiment, power manager 320 draws power irrespective of an allocated or non-allocated power budget for the associated operating circuitry 330, 460. In another embodiment, power requirements are supplied by a user utilizing a host computer or controller communicating with management module 110. It is further understood, that in the event that an unmanaged module is attached which draws power from power supplies 100, the power drawn by the unmanaged module is to be input by a user utilizing a host computer or controller communicating with management module 110. The input power drawn for the unmanaged module is to be deducted from any available power budget, since the unmanaged module can not reduce consumption in response to management module 110.

In stage 1010 information regarding the total available power for the modules whose power requirements were input in stage 1000 is input. In an exemplary embodiment status information 405 in combination with current indicator 410 provides information regarding power availability. In another embodiment a host controller or computer is operable by a user to input a rated power capability of each power supply 100 exhibiting a power good signal via status information 405. In one embodiment the rated power is discounted by an estimate of the power usage of management module 110 and other inherent losses in the system including power used by each power manager 320. In another embodiment the rated power is further discounted by inherent losses of each DC/DC converter 300. In another embodiment a maximum power usage to be allocated for non-power managed modules attached to rack and drawing power from power supplies 100 is input in stage 1000 and deducted in stage 1010. In another embodiment the power usage reported by power manger 320 for operating circuit 460 comprises power allocated by a PoE managing circuit 470 due to classification irrespective as to the amount of power actually drawn by a PD.

In stage 1020 a power budget is allocated for each module whose power requirements were input in stage 1000 on an equal basis. In one embodiment, in the event that the desired power requirement as input in stage 1000 is fully met, no additional power is allocated to the module, and the balance of the available power is thus allocated to other modules. In another embodiment power is allocated as a percentage of the desired power requirements, and thus power is budgeted equally on a pro-rata basis of the maximum desired power. The above embodiments are not meant to be limiting in any way and are specifically meant to include utilizing a combination of factors to allocate a power budget. The power budgets determined are transmitted to power managers 320 of each of the modules.

In stage 1030 power availability as indicated by status information 405 in combination with current indicator 410 is continuously monitored and the dynamically changing power requirements of the modules are again input. It is to be understood that the power requirement of the modules may change on a dynamic basis, for example if one module comprises a PoE device, the addition or removal of a PD changes the power requirements associated with the PoE device to which it is connected, or from which it has been removed.

In stage 1040 the dynamically variable power requirements are compared with the continuously updated power availability. In the event that in stage 1040, sufficient power is available for all modules, stage 1020 as described above is executed. It is to be understood that additional power may be allocated, or budgeted, to at least one attached module without affecting the operation of other modules, as sufficient power has been determined to be available from power supplies 100.

In the event that in stage 1040, sufficient power is not available for all modules, in stage 1050 power is reallocated to all attached modules. It is to be understood that at least one module may have its power budget reduced. Power is reallocated for each module on an equal basis. In one embodiment, in the event that the dynamic desired power requirement of a module as input in stage 1030 is fully met, no additional power is allocated to the module, and the balance of the available power is thus allocated to other modules. In another embodiment power is allocated as a percentage of the dynamic desired power requirements, and thus power is budgeted equally on a pro-rata basis of the maximum desired power. The above embodiments are not meant to be limiting in any way and are specifically meant to include utilizing a combination of factors to allocate a power budget. The power budgets determined are transmitted to power managers 320 of each of the modules. Preferably reallocation according to stage 1050 is in accordance with the same method used for allocation in stage 1020. After the operation of stage 1050, stage 1030 as described above is again executed.

The method of FIG. 5 is preferably run at start up, and further preferably the loop of stages 1020-1050 is run continuously, or on a periodic basis, or in response to a sensed change in one of the dynamic power requirements and the power availability.

Figure 6:
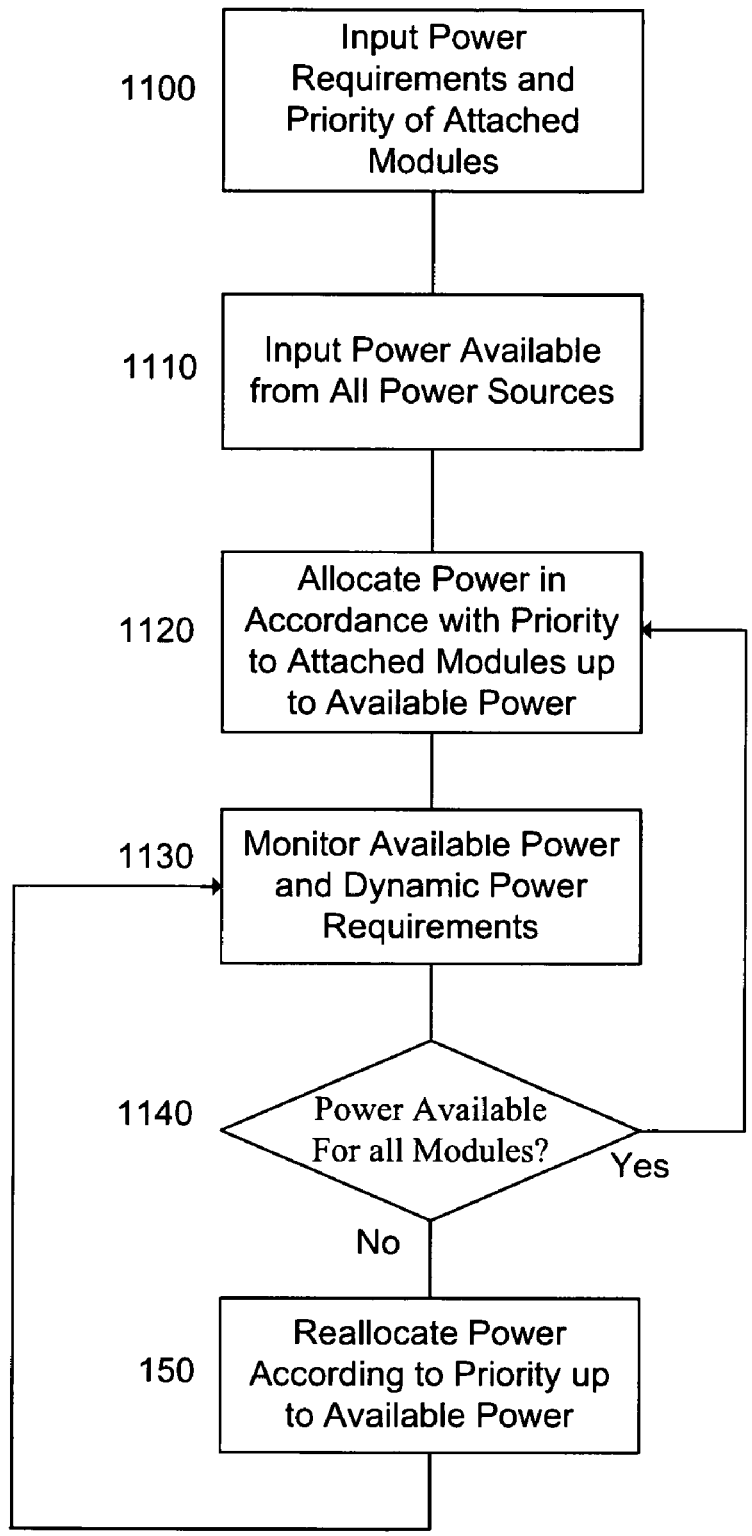
FIG. 6 illustrates a high level flow chart of an embodiment of the operation of the management module to allocate power according to priority to power managed modules in accordance with the principle of the current invention.

FIG. 6 illustrates a high level flow chart of an embodiment of the operation of management module 110 of FIGS. 4A, 4B to allocate power according to priority to power managed modules in accordance with the principle of the current invention. In stage 1100 the power requirements and priority levels of all attached modules are input. In an exemplary embodiment, a minimum and a desired power requirement are supplied by the local power manager 320. It is to be understood that in this embodiment, power manager 320 draws power irrespective of an allocated or non-allocated power budget for the associated operating circuitry 330, 460. In another embodiment, at least one of power requirements and priority levels are supplied by a user utilizing a host computer or controller communicating with management module 110. It is further understood, that in the event that an unmanaged module is attached which draws power from power supplies 100, the power drawn by the unmanaged module is to be input by a user utilizing a host computer or controller communicating with management module 110. The input power drawn for the unmanaged module is to be deducted from any available power budget, since the unmanaged module can not reduce consumption in response to management module 110.

In stage 1110 information regarding the total available power for the modules whose power requirements were input in stage 1100 is input. In an exemplary embodiment status information 405 in combination with current indicator 410 provides information regarding power availability. In another embodiment a host controller or computer is operable by a user to input a rated power capability of each power supply 100 exhibiting a power good signal via status information 405. In one embodiment the rated power is discounted by an estimate of the power usage of management module 110 and other inherent losses in the system including power used by each power manager 320. In another embodiment the rated power is further discounted by inherent losses of each DC/DC converter 300. In another embodiment a maximum power usage to be allocated for non-power managed modules attached to rack and drawing power from power supplies 100 is input in stage 1100 and deducted in stage 1110. In another embodiment the power usage reported by power manger 320 for operating circuit 460 comprises power allocated by a PoE managing circuit 470 due to classification irrespective as to the amount of power actually drawn by a PD.

In stage 1120 a power budget is allocated for each module whose power requirements were input in stage 1100 in accordance with priority. Power requirements of modules exhibiting high priority receive a power allocation up to the power requirements prior to power being allocated to modules of a lower priority. In one embodiment power is allocated on an equal basis to modules of the same priority or as a percentage of the desired power requirements, and thus power is budgeted equally to modules of the same priority on a pro-rata basis of the maximum desired power. The above is not meant to be limiting in any way and are specifically meant to include utilizing a combination of factors to allocate a power budget. The power budgets determined are transmitted to power managers 320 of each of the modules. Once power has been allocated to the highest priority modules, power is allocated to lower priority modules in a similar fashion.

The above has been described as having modules with priority, however this is not meant to be limiting in any way. In one embodiment, a module may have a minimum operating requirement at a high priority, with additional power requirements at a lower priority. Thus, the module will almost always receive a minimum operating power level, and in the event of additional power be supplied with an additional power allocation.

In stage 1130 power availability as indicated by status information 405 in combination with current indicator 410 is continuously monitored and the dynamically variable power requirements of the modules are again input. It is to be understood that the power requirement of the modules may change on a dynamic basis, for example if one module comprises a PoE device, the addition or removal of a PD changes the power requirements associated with the PoE device to which it is connected, or from which it has been removed.

In stage 1140 the dynamically variable power requirements are compared with the continuously update power availability. In the event that in stage 1140, sufficient power is available for all modules, stage 1120 as described above is executed. It is to be understood that additional power may be allocated, or budgeted, to at least one attached module without affecting the operation of other modules, as sufficient power has been determined to be available from power supplies 100.

In the event that in stage 1140, sufficient power is not available for all modules, in stage 1150 power is reallocated to all attached modules. It is to be understood that at least one module may have its power budget reduced. Power is reallocated for each module in accordance with priority. Power requirements of modules exhibiting high priority receive a power allocation up to the power requirements prior to power being allocated to modules of a lower priority. In one embodiment power is reallocated on an equal basis to modules of the same priority or as a percentage of the desired power requirements, and thus power is budgeted equally to modules of the same priority on a pro-rata basis of the maximum desired power. The above is not meant to be limiting in any way and are specifically meant to include utilizing a combination of factors to reallocate a power budget. The power budgets determined are transmitted to power managers 320 of each of the modules. Once power has been allocated to the highest priority modules, power is reallocated to lower priority modules in a similar fashion.

Preferably reallocation according to stage 1150 is in accordance with the same method used for allocation in stage 1120. After the operation of stage 1150, stage 1130 as described above is again executed.

The method of FIG. 6 is preferably run at start up, and further preferably the loop of stages 1120-1150 is run continuously, or on a periodic basis, or in response to a sensed change in one of the dynamic power requirements and the power availability.

Figure 7:
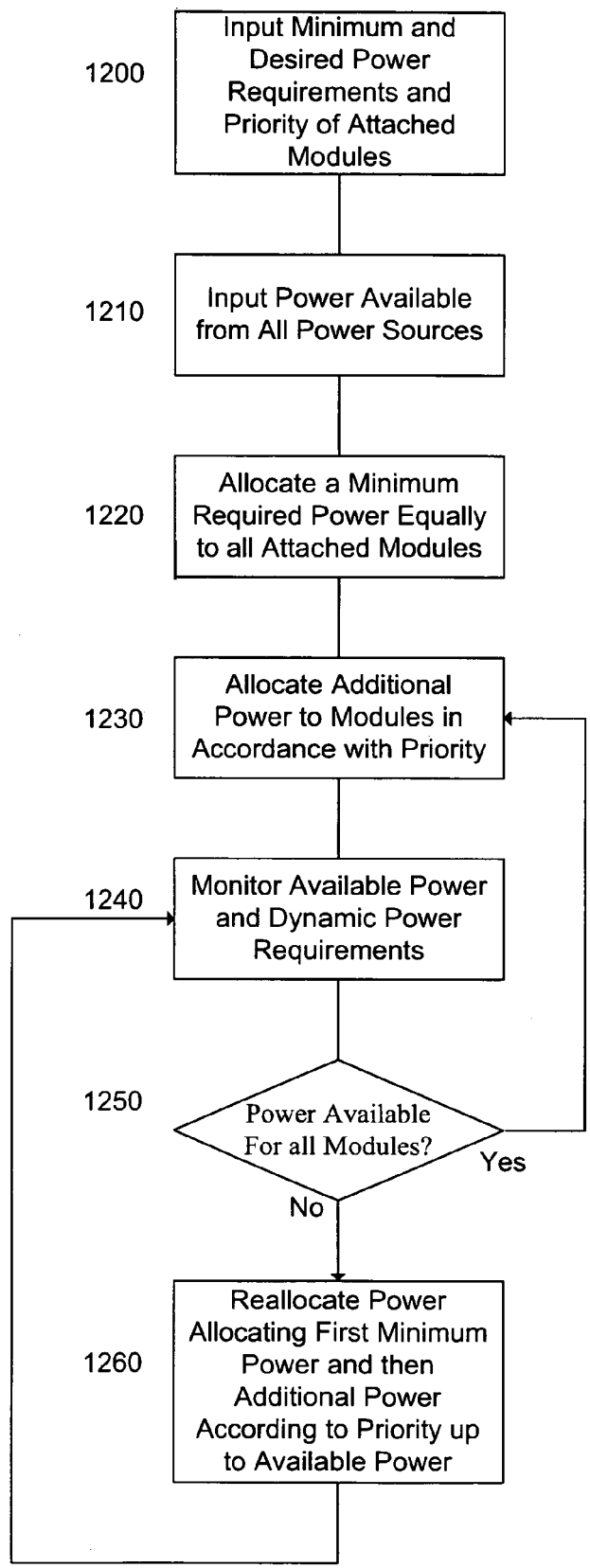
FIG. 7 illustrates a high level flow chart of an embodiment of the operation of the management module to allocate a minimum power level to all power managed modules, and to allocate any additional available power according to priority in accordance with the principle of the current invention.

FIG. 7 illustrates a high level flow chart of an embodiment of the operation of the management module 110 of FIGS. 4A, 4B to allocate a minimum power level to all power managed modules, and to allocate any additional available power according to priority in accordance with the principle of the current invention. In stage 1200 the power requirements comprising a minimum and a desired power requirement and priority levels of all attached modules are input. In an exemplary embodiment, the minimum and desired power requirements are supplied by the local power manager 320. It is to be understood that in this embodiment, power manager 320 draws power irrespective of an allocated or non-allocated power budget for the associated operating circuitry 330, 460. In another embodiment, at least one of power requirements and priority levels are supplied by a user utilizing a host computer or controller communicating with management module 110. It is further understood, that in the event that an unmanaged module is attached which draws power from power supplies 100, information regarding the power drawn by the unmanaged module is to be input by a user utilizing a host computer or controller communicating with management module 110. The input power drawn for the unmanaged module is to be deducted from any available power budget, since the unmanaged module can not reduce consumption in response to management module 110.

In stage 1210, information regarding the total available power for the modules whose power requirements were input in stage 1200 is input. In an exemplary embodiment status information 405 in combination with current indicator 410 provides information regarding power availability. In another embodiment a host controller or computer is operable by a user to input a rated power capability of each power supply 100 exhibiting a power good signal via status information 405. In one embodiment the rated power is discounted by an estimate of the power usage of management module 110 and other inherent losses in the system including power used by each power manager 320. In another embodiment the rated power is further discounted by inherent losses of each DC/DC converter 300. In another embodiment a maximum power usage to be allocated for non-power managed modules attached to rack and drawing power from power supplies 100 is input in stage 1200 and deducted in stage 1210. In another embodiment the power usage reported by power manger 320 for operating circuit 460 comprises power allocated by a PoE managing circuit 470 due to classification irrespective as to the amount of power actually drawn by a PD.

In stage 1220 a minimum power budget is allocated for each module whose minimum power requirements were input in stage 1200 equally. In another embodiment power is allocated on an equal basis to all modules up to the minimum power requirement as a percentage of the desired power requirements, and thus power is budgeted equally to modules of the same priority on a pro-rata basis of the minimum required power. The above embodiments are not meant to be limiting in any way and are specifically meant to include utilizing a combination of factors to allocate a power budget. In one embodiment, minimum power allocation is done in order of priority. The power budgets determined are transmitted to power managers 320 of each of the modules.

In stage 1230 additional available power, in excess of the power allocated in stage 1220, is allocated for each module whose power requirements were input in stage 1200 in accordance with priority. Power requirements of modules exhibiting high priority receive a power allocation up to the power requirements prior to power being allocated to modules of a lower priority. In one embodiment power is allocated on an equal basis to modules of the same priority or as a percentage of the desired power requirements, and thus power is budgeted equally to modules of the same priority on a pro-rata basis of the maximum desired power. The above is not meant to be limiting in any way and are specifically meant to include utilizing a combination of factors to allocate a power budget. The additional power budgets determined are transmitted to power managers 320 of each of the modules. Once power has been allocated to the highest priority modules, power is allocated to lower priority modules in a similar fashion.

In stage 1240 power availability as indicated by status information 405 in combination with current indicator 410 is continuously monitored and the dynamically variable power requirements of the modules are again input. It is to be understood that the power requirement of the modules may change on a dynamic basis, for example if one module comprises a PoE device, the addition or removal of a PD changes the power requirements associated with the PoE device to which it is connected, or from which it has been removed.

In stage 1250 the dynamically variable power requirements are compared with the continuously update power availability. In the event that in stage 1250 sufficient power is available for all modules, stages 1230 and 1240 as described above is executed. It is to be understood that additional power may be allocated, or budgeted, to at least one attached module without affecting the operation of other modules, as sufficient power has been determined to be available from power supplies 100.

In the event that in stage 1250 sufficient power is not available for all modules, in stage 1260 power is reallocated to all attached modules. It is to be understood that at least one module may have its power budget reduced. Power is reallocated for each module in accordance with priority, with a minimum required power being first allocated to all modules. Power requirements of modules exhibiting high priority receive a power allocation up to the power requirements prior to power being allocated to modules of a lower priority. In one embodiment power is reallocated on an equal basis to modules of the same priority or as a percentage of the desired power requirements, and thus power is budgeted equally to modules of the same priority on a pro-rata basis of the maximum desired power. The above is not meant to be limiting in any way and are specifically meant to include utilizing a combination of factors to reallocate a power budget. The power budgets determined are transmitted to power managers 320 of each of the modules. Once power has been allocated to the highest priority modules, power is reallocated to lower priority modules in a similar fashion.

Preferably reallocation according to stage 1260 is in accordance with the same method used for allocation in stages 1220 and 1230. After the operation of stage 1260, stage 1240 as described above is again executed.

The method of FIG. 7 is preferably run at start up, and further preferably the loop of stages 1230-1260 is run continuously, or on a periodic basis, or in response to a sensed change in one of the dynamic power requirements and the power availability.

Figure 8:
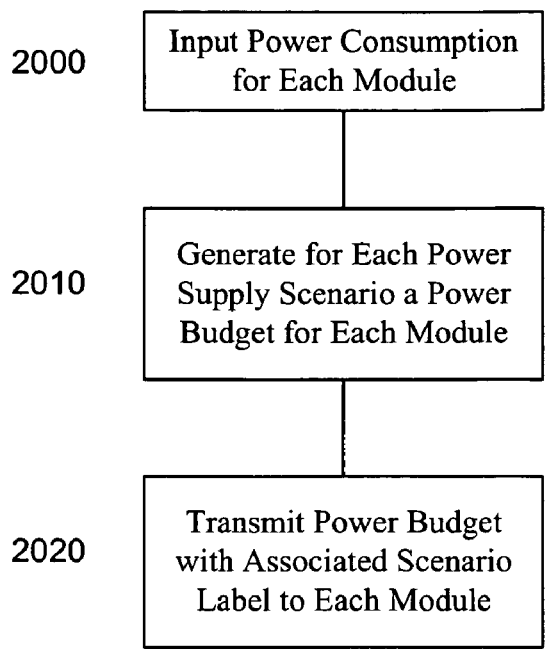
FIG. 8 is a high level flow chart of an ongoing operation of the management module to maintain a potential scenario chart comprising power budgets for each power managed module according to an aspect of the invention.

FIG. 8 is a high level flow chart of an ongoing operation of management module 110 of FIGS. 4A, 4B to maintain a potential scenario chart comprising power budgets for each power managed module according to an aspect of the invention. In stage 2000 power consumption of all attached modules is input. While stage 2000 has been described as inputting power consumption, this is not meant to be limiting in any way. A minimum power requirement, or a plurality of power requirements and priorities, or an allocated power which may be called upon but not utilized, may be input without exceeding the scope of the invention. In one embodiment management module 110 communicates with each power manager 320 and receives an indication of power consumption. In another embodiment power consumption is input based on current indicator 410 of power supplies 100.

In stage 2010 for each power source scenario a power budget for each module is determined. In an exemplary embodiment a power supply scenario is defined as the loss of one or more of the plurality of power supplies 100 of FIG. 4A. In the event that all of the plurality of power supplies 100 are of the same rating, only a single scenario for each number of remaining power sources is required. In the event that some or all of the plurality of power supplies 100 exhibit different power ratings, each potential total power output of the plurality of power supplies 100 for which one of the power supplied have failed is taken as a potential scenario. For each of the potential scenarios a revised power budget is calculated for each module. Preferably, the power budget determined is in accordance with stage 1050 of FIG. 5, 1150 of FIG. 6 or 1260 of FIG. 7. Thus, while the operation of respective stages 1050, 1150 and 1260 are in response to small changes in power availability or power demand, the operation of stage 2010 develops a potential action for each potential power source scenario.

Stage 2010 will be described herein as being responsive to status indicator 405 of each power supply having a binary value in which a value of 1 indicates full rated power availability and a value of 0 indicates no power. This is not meant to be limiting in any way, and a multiplicity of values, including derating due to an increased temperature or stress level is specifically intended.

Table I is a representation of an embodiment of the potential scenario chart produced as an outcome of stage 2010 in accordance with the principle of the invention.

TABLE I

| Power Indicator 405 of Power Supply 1 | Power Indicator 405 of Power Supply 2 | Power Indicator 405 of Power Supply 3 | Total Power Available | Scenario Number | Power Budget Per Module |
|---|---|---|---|---|---|
| 0 | 0 | 0 | 0 Watts | 0 | 0 |
| 0 | 0 | 1 | 500 Watts | 1 | 500/(Number of Modules) |
| 0 | 1 | 0 | 650 Watts | 2 | 650/(Number of Modules) |
| 0 | 1 | 1 | 1150 Watts | 3 | 1150/(Number of Modules) |
| 1 | 0 | 0 | 600 Watts | 4 | 600/(Number of Modules) |
| 1 | 0 | 1 | 1100 Watts | 5 | 1100/(Number of Modules) |
| 1 | 1 | 0 | 1250 Watts | 6 | 1250/(Number of Modules) |
| 1 | 1 | 1 | 1750 Watts | 7 | 1750/(Number of Modules) |

For each possible combination of power indicators 405 a total power available is determined and a scenario number is assigned. A total scenario available power is determined and a power budget per module is determined. Table I is described as assigning an equal power budget to each module, as described above in relation to FIG. 5, however this is not meant to be limiting in any way. A scenario power budget may be based on a minimum power requirement, a percentage of current power usage as input in stage 2000, or take priority into account without exceeding the scope of the invention. In one embodiment power is budgeted for all high priority power requirements first, and then subsequent power requirements of lower priority are budgeted.

In stage 2020 the scenarios associated with the power budget for each scenario is transmitted to each of the power managers 320 of the respective attached modules. In the event of a change in the value of power indicator 405 of one of power supplies 100, management module 110 will operate to broadcast the scenario number to change to in a manner that will be further described below. In one embodiment the broadcast is done on the provided emergency bus as described above in relation to FIGS. 4A, 4B, 11A and 11B.

Thus, the routine of FIG. 8 prepares and transmits potential power event scenarios to each connected power manager 320 associated with a potential power budget for each of the scenarios. Preferably the routine of FIG. 8 is run on a periodic basis, maintaining an update scenario chart so that failure of one or more power supplies 100 may be responded to rapidly by reducing power drawn, thereby preventing a total system crash due to overload of the remaining power supplies 100.

Figure 9:
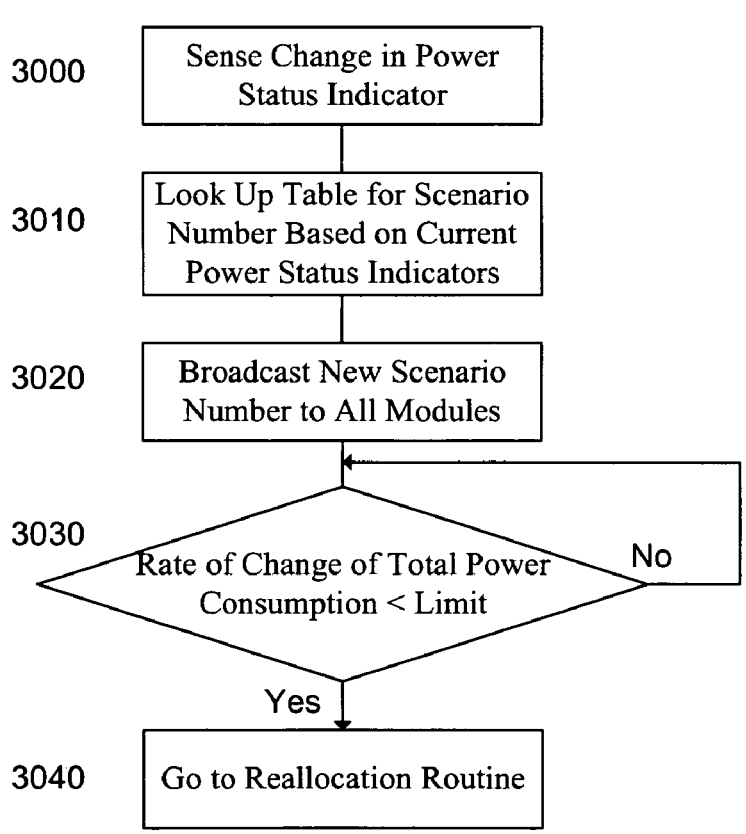
FIG. 9 is a high level flow chart of the operation of the management module, in accordance with the principle of the current invention, in the event of a change in power condition associated with one or more power supplies.

FIG. 9 is a high level flow chart of the operation of the management module 110 of FIGS. 4A, 4B in accordance with the principle of the current invention, in the event of a change in power condition associated with one or more power sources. In stage 3000 a change in power status indicator is sensed. As described above, the power status indicator in one embodiment presents a binary value indicating either full or no power, and in another embodiment presents a plurality of values indicative of a need to derate the power supply 100 associated with the status indicator 405. In stage 3010 the table generated in stage 2010 of FIG. 8 is retrieved from memory, and the scenario number associated with the current status indicators 405 is retrieved. In stage 3020 the scenario number retrieved in stage 3010 is broadcast to all power managers 320. In one embodiment the scenario number is broadcast on the provided emergency bus as described above in relation to FIGS. 4A, 4B, 11A and 11B. It is to be understood that power mangers 320, upon receipt of the broadcast immediately acts to update the power drawn to the amount received in stage 2020 of FIG. 8. In an embodiment of a PoE operating circuitry, such as operating circuitry 460 of FIG. 4A, each PoE managing circuit 470 is instructed to disable ports if required, preferably observing local priority, to achieve the revised local power budget. In an embodiment of operating circuitry 330 of FIG. 4A, power manager 320 reduces power drawn, by reducing the clock speed or shedding other loads.

The above has been described in relation to management module 110 transmitting power budgets for each potential scenario, however this is not meant to be limiting in any way. Alternatively, management module 110 may transmit an allocation reduction to each power manager for each scenario without exceeding the scope of the invention. In such an embodiment, responsive to the broadcast message of stage 3020, each power manager 320 is operative to reduce power drawn by the pre-transmitted amount in accordance with the scenario broadcast received.

In stage 3030 total power consumption, preferably as determined by current indicators 410 of FIG. 4A, is monitored to ensure that power has stabilized such that the rate of change of total power consumption is less than the a predetermined limit. In an exemplary embodiment stage 3030 is implemented using fuzzy logic. In the event that total power consumption has not stabilized stage 3030 is repeated. In the event that in stage 3030 total power consumption has stabilized, in stage 3040 a reallocation routine as described above in relation to FIGS. 5-7 is called. Thus, the operation of stage 3020 results in a rapid reduction of power drawn, and stage 3030 allows for stabilization at the reduced power allocatoins. Reallocation in accordance with stages 1030-1050 of FIG. 5, 1130-1150 of FIG. 6 or 1240-1260 of FIG. 7 fine tunes the system in accordance with the available power.

Stage 3030 is described herein as observing the rate of change of total power consumption, however this is not meant to be limiting in any way. Stage 3030 may be replaced with a stage awaiting confirmation from each of the plurality of power managers 320 that power drawn is within budget, or with a fixed delay, without exceeding the scope of the invention.

The implementation of the methods of FIGS. 8 and 9, as described above in relation to Table I, thus enable a preplanned power reduction for power managed devices in the event that any change to the power source condition occurs. The table is updated regularly according to the method of FIG. 8, and represents a list of scenarios and allocated power budgets for each power managed device in the event that the power source condition changes from the current power source condition, to any other condition.

Figure 10:
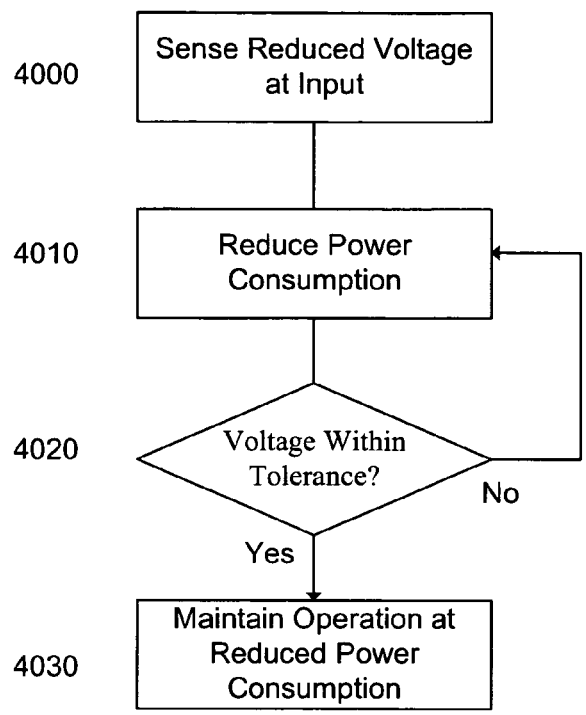
FIG. 10 is a high level flow chart of the operation of a power manager to automatically detect a reduced power availability, and in response reduce power consumption in accordance with the principle of the current invention.

FIG. 10 is a high level flow chart of the operation of a power manager 320 to automatically detect a reduced power availability, and in response reduce power consumption in accordance with the principle of the current invention. In stage 4000 the voltage at the power managed device is monitored and a reduced voltage is detected. Such a reduced voltage is indicative of an overload condition. In the event that communication with management module 110 was in operation, a reduced power budget for one or more power managers 320 would be transmitted by management module 110.

Power manager 320, in response to a sensed reduction in voltage in stage 4000, and in the absence of communication with management module 110, in stage 4010 reduces power consumption. In an exemplary embodiment power manager 320 communicates with a respective operating circuit 330, 460 to reduce power consumption by a pre-determined amount or percentage. In another embodiment, power is consumed in levels or stages, and power is reduced to the next lower level.

In stage 4020, voltage at the power managed device is again monitored. In the event that voltage has stabilized within tolerance, in stage 4030 the power allocation is maintained for operating circuit 330, 460 in accordance with the reduced setting of stage 4010. Thus, the reduced setting is treated as a revised power budget in the absence of communication with management module 110.

In the event that in stage 4020 voltage has not stabilized to be within tolerance, stage 4010 is again run to further reduce power drawn. It is to be understood that preferably the operation of stage 4010 does not reduce power below a minimum operating level.

Thus, the present embodiments enable a system having at least one power source, a management module and a plurality of power managed modules in communication with the management module. Each of the power managed modules are arranged to be able to draw at least some power from the at least one power source. Each of the power managed modules comprises a power manager operable to control the power drawn by the power managed module. The management module allocates a power budget for each of the power managed modules, and the power managers of the power managed modules operate to control module operation so that power drawn is within the allocated budget.

Power managed modules may comprise PoE devices, switches, hubs, concentrators, computing equipment or other telecommunication modules operable at a plurality of power levels. Power managed modules may be supplied with an on board power supply, or preferably without an on board power supply. A central power source, preferably comprising at least one power supply, and further preferably comprising a plurality of power supplies, thus optimally supplies operating power for some or all of the power managed modules within the rack. The management module allocates power for each of the power managed modules drawing power.

The power budget is dynamically allocated based on pre-defined criteria. In the event of a failure of one or more power supplies of the central power source, in one embodiment the management module directs each of the power managed modules to change their power consumption to a pre-assigned amount. In another embodiment, in the event of a failure of one or more power supplies, the management module directs each of the power managed modules to reduce their power consumption by a pre-assigned amount.

In one embodiment, the power manager of at least one power managed module may sense a change in a voltage level from the at least one power source, and in response reduce power consumption. Such a response enables automatic power management by the power manager in the absence of communication from the management module.

In one embodiment the central power source comprises a plurality of power supplies, arranged in an N+M redundant arrangement. The management module reserves the power of M redundant power supplies so as to provide the budgeted power in the absence of one or more failed power supplies. The invention thus provides chassis functionality for distributed rack level equipment.

In one embodiment the system provides a plurality of buses, a first bus of which is used for ongoing communication of power requirements and budgets, and a second bus being used for emergency communication, such as in the event of a failure of at least one power supply of the central power source. A plurality of scenarios are generated and pre-transmitted to the modules, preferably over the first bus. In the event of a power event, such as the failure of one or more power supplies, one of the scenarios is implemented by broadcasting an implementing message, preferably over the second bus. Further preferably, at least one of the first and second bus is arranged in a closed ring configuration, thus allowing for identifying a communication breakdown by monitoring a loop back path.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description and which are not in the prior art.

We claim:

1. A system for rack level power management, the system comprising:
   at least one power source;
   a management module; and
   a plurality of power managed modules in communication with said management module and connected to draw power from said at least one power source, each of said plurality of power managed modules comprising a power manager and an operating circuit, said operating circuit being operable at a plurality of power drawing levels responsive to said power manager,
   said management module being operative to dynamically allocate a power budget to each of said plurality of power managed modules and communicate said dynamically allocated power budgets to said power managers,
   each of said power managers being operative to monitor and control said operating circuit of said power managed module to be operable at a power drawing level within said dynamically allocated budget responsive to said monitoring.

2. A system according to claim 1, wherein said management module is connected to receive an indication of power availability from said at least one power source, said power budgets being dynamically allocated responsive said received indication.

3. A system according to claim 1, wherein said management module is operative to dynamically allocate power budgets on the basis of priority, each of said power managed modules being assigned a priority.

4. A system according to claim 1, wherein said plurality of power managed modules exhibits a minimum required power and an additional power level in excess of said minimum required power, said management module being operative to assign a power budget for said minimum required power for each of said plurality of power managed modules, and in the event that additional power is available, to allocate a power budget for said additional power level of at least one of said plurality of power managed modules.

5. A system according to claim 4, wherein said power budget for said additional power level is allocated on a priority basis.

6. A system according to claim 1, wherein each of said plurality of power managers comprises a power meter, said power manager of each of said plurality of power managers receiving an indication of power drawn from said power meter, said monitoring being responsive to said received indication of power drawn.

7. A system according to claim 1, wherein at least one of said plurality of power managed modules is selected from the group consisting of power over a Ethernet enabled switch, a switch, a hub, a concentrator, a computing equipment, a power sourcing device, and a telecommunication module.

8. A system according to claim 1, wherein said operating circuit of at least one of said plurality of power managed modules comprises a power sourcing device operable for use with a power ready patch panel.

9. A system according to claim 1, wherein said at least one power source and said management module are comprised within a single equipment shelf.

10. A system according to claim 1, wherein said management module is further operative to input a total power available, said allocated power budgets being responsive to said input total available power.

11. A system according to claim 10, further comprising at least one unmanaged module not comprising a power manager, said management module being operative to reduce the power requirements of said at least one unmanaged module from said input total available power.

12. A system according to claim 1, wherein said management module is further operative to transmit at least one power budget scenario, said management module being further operative to monitor a condition of said at least one power source, and in the event of a change in said monitored condition, to broadcast a command associated with a particular one of said at least one power budget scenario to said plurality of power managed modules, said plurality of power managed modules being operative to monitor and control, responsive to said monitoring, said operating circuit of said power managed module so as to adhere to said particular power budget scenario responsive to said broadcast command.

13. A system according to claim 12, further comprising a first bus and a second bus, wherein said management module is operative to transmit said at least one power budget scenario via said first bus and to broadcast said command via said second bus.

14. A system according to claim 13, wherein at least one of said first bus and said second bus in arranged in a closed ring arrangement.

15. A system according to claim 1, further comprising at least one communication bus arranged in a closed ring configuration, said management module being operative to communicate said allocated power budgets via said at least one communication bus.

16. A system according to claim 15, wherein said management module is further operative to monitor a loop back path of said at least one communication bus, and in the event that said communicated allocated power budgets are not received via said monitored loop back, to communicate said allocated power budgets via said loop back path.

17. A system according to claim 1, wherein said power manager of at least one said plurality of power managed modules is further operative to sense a reduced voltage, and responsive to sensed reduced voltage to monitor and control said operating circuit associated with said power manager, responsive to said monitoring, to reduce power drawn.

18. A method of rack level power management comprising:
providing at least one power source;
providing a plurality of power managed modules connected to draw power from said at least one power source;
dynamically allocating a power budget to each of said provided plurality of power managed modules; and
transmitting said dynamically allocated power budgets to said plurality of power managed modules,
each of said power managed modules monitoring and controlling, responsive to said monitoring, said drawn power to be within said transmitted dynamically allocated power budget.

19. A method according to claim 18, further comprising:
receiving an indication of power availability from said at least one power source,
said dynamically allocating being responsive said received indication.

20. A method according to claim 18, wherein said dynamically allocating is at least partially on the basis of priority.

21. A method according to claim 18, wherein said provided plurality of power managed modules exhibit a minimum required power and an additional power level in excess of said minimum required power, said stage of dynamically allocating comprising:
allocating said minimum required power for each of said plurality of power managed modules, and
in the event that additional power is available, allocating a power budget for said additional power level of at least one of said plurality of power managed modules.

22. A method according to claim 21, wherein said allocating a power budget for said additional power level is on a priority basis.

23. A method according to claim 18, wherein said monitoring comprises receiving an indication of power actually drawn by said power managed module.

24. A method according to claim 18, wherein at least one of said provided plurality of power managed modules is selected from the group consisting of power over a Ethernet enabled switch, a switch, a hub, a concentrator, a computing equipment, a power sourcing device, and a telecommunication module.

25. A method according to claim 18, wherein at least one of said provided plurality of power managed modules comprises a power sourcing device operable for use with a power ready patch panel.

26. A method according to claim 18, further comprising:
inputting a total power available,
said dynamically allocating a power budget being responsive to said input total available power.

27. A method according to claim 26, further comprising:
providing at least one power unmanaged module; and
deducting the power requirements of said at least one power unmanaged module from said input total available power.

28. A method according to claim 18, further comprising:
monitoring a condition of said provided at least one power source;
transmitting at least one power budget scenario to said provided plurality of power managed modules; and
in the event of a change in said monitored condition, broadcasting a command associated with a particular one of said transmitted at least one power budget scenario to said plurality of power managed modules, said plurality of power managed modules monitoring and controlling, responsive to said monitoring, said drawn power responsive to said broadcast command thereby adhering to said transmitted particular power budget scenario.

29. A method according to claim 18, the method further comprising:
at least one of said provided plurality of power managed modules sensing a reduced voltage; and
responsive to sensed reduced voltage, reducing power drawn by said provided power managed module.

30. A method according to claim 18, further comprising:
monitoring a loop back path of said transmitted allocated power budgets; and
in the event that at least one of said transmitted allocated power budgets is not sensed by said monitoring, retransmitting said not sensed power budget via said loop back path.

31. A method according to claim 18, further comprising:
monitoring a condition of said provided at least one power source;
transmitting at least one power budget scenario to said provided plurality of power managed modules via a first bus; and in the event of a change in said monitored condition, broadcasting a command associated with a particular one of said transmitted at least one power budget scenario to said plurality of power managed modules via a second bus different than said first bus, said plurality of power managed modules monitoring and controlling, responsive to said monitoring, said drawn power thereby adhering to said particular power budget scenario responsive to said broadcast command.

32. A system for rack level power management, the system comprising:

at least one power source comprising a plurality of power supplies;

a management module; and a plurality of power managed modules in communication with said management module and connected to draw power from said at least one power source, each of said plurality of power managed modules comprising a power manager and an operating circuit, said operating circuit being operable at a plurality of power drawing levels responsive to said power manager, said management module being operative to dynamically allocate a power budget to each of said plurality of power managed modules and communicate said dynamically allocated power budgets to said power managers, and being further operative to communicate a plurality of power scenarios and associated power budgets to said power managed modules, each of said power managers being operative to monitor power drawn by said operating circuit of said power managed module and control, responsive to said monitoring, the power drawn by said operating circuit of said power managed module to be operable at a power drawing level within said dynamically allocated budget, and in response to a communication from said management module to activate a particular one of said communicated plurality of power scenarios, to control, responsive to said monitoring, said operating circuit of said power managed module to be operable at a power drawing level within said power budget associated with said particular activated scenario.

* * * * *